US012414386B2

(12) United States Patent
Lachenal et al.

(10) Patent No.: US 12,414,386 B2
(45) Date of Patent: Sep. 9, 2025

(54) PHOTOVOLTAIC DEVICE AND METHOD FOR MANUFACTURING THE SAME

(71) Applicant: MEYER BURGER (GERMANY) GMBH, Hohenstein-Ernstthal (DE)

(72) Inventors: Damien Lachenal, Cortaillod (CH); Pierre Papet, Hauterive (CH); Till Kössler, Morges (CH)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 11 days.

(21) Appl. No.: 18/247,801

(22) PCT Filed: Oct. 15, 2021

(86) PCT No.: PCT/EP2021/078719
§ 371 (c)(1),
(2) Date: Apr. 4, 2023

(87) PCT Pub. No.: WO2022/084205
PCT Pub. Date: Apr. 28, 2022

(65) Prior Publication Data
US 2024/0014339 A1      Jan. 11, 2024

(30) Foreign Application Priority Data
Oct. 22, 2020   (EP) ..................................... 20203399

(51) Int. Cl.
*H10F 19/90* (2025.01)
*H10F 10/16* (2025.01)

(52) U.S. Cl.
CPC ........... *H10F 19/908* (2025.01); *H10F 10/16* (2025.01)

(58) Field of Classification Search
CPC ............. H01L 31/0504; H01L 31/0516; H01L 31/0682; H01L 31/072; H01L 31/18; H10F 19/908; H10F 10/16
See application file for complete search history.

(56) References Cited

U.S. PATENT DOCUMENTS

| 6,274,402 B1 | 8/2001 | Verlinden et al. |
| 9,362,426 B2 | 6/2016 | Goto et al. |

(Continued)

FOREIGN PATENT DOCUMENTS

| CN | 111 799 348 | 10/2020 |
| CN | 111799348 A | * 10/2020 |

(Continued)

OTHER PUBLICATIONS

Machine translation of CN-111799348-A. (Year: 2020).*

(Continued)

*Primary Examiner* — Mayla Gonzalez Ramos
(74) *Attorney, Agent, or Firm* — NIXON & VANDERHYE

(57) ABSTRACT

Disclosed is a method to fabricate an interdigitated back contact photovoltaic device including: providing a substrate of a first-type doping being an n-type or a p-type doping; realizing on a back side a semiconducting doped structure including individual doped layers portions of the first type doping and a semiconducting doped structure of a second type; realizing a conductive layer on top of the semiconducting structure; realizing a patterned isolation resist layer having contact apertures and isolation apertures onto the conductive layer; further applying conductive pads to the contact apertures; and etching the conductive layer up to the second-type doped layer to realize trenches to electrically separate first type charge collecting structures from second type charge collecting structures. Also disclosed is an interdigitated back contact photovoltaic device as manufactured (Continued)

according to the disclosed method of fabrication, and a photovoltaic system including at least two interdigitated back contact photovoltaic devices.

20 Claims, 15 Drawing Sheets

(56) References Cited

U.S. PATENT DOCUMENTS

| | | | |
|---|---|---|---|
| 2005/0062041 A1* | 3/2005 | Terakawa | H01L 31/0747 257/53 |
| 2008/0156372 A1* | 7/2008 | Wu | H01L 31/046 257/E27.125 |
| 2015/0059822 A1* | 3/2015 | Krokoszinski | H01L 31/022441 438/98 |
| 2015/0072467 A1* | 3/2015 | Chan | H01L 31/068 438/98 |
| 2015/0280029 A1* | 10/2015 | Harley | H01L 31/022441 136/256 |
| 2019/0237608 A1* | 8/2019 | Fujishima | H01L 31/0747 |

FOREIGN PATENT DOCUMENTS

| | | | |
|---|---|---|---|
| EP | 1 519 422 | 5/2018 | |
| WO | WO-2017008120 A1 * | 1/2017 | H01L 31/022441 |

OTHER PUBLICATIONS

International Search Report and Written Opinion of the ISA for PCT/EP2021/078719, mailed Jan. 26, 2022, 12 pages.

J.C. Stang, "Interdigitated Back Contact Silicon Heteroiunction Solar Cells", Thesis TU Berlin 2018.

N.Mingirulli et al, "Efficient interdigitated back-contacted silicon heterojunction solar cells", Phys. status solidi-Rapid Res.Lett., vol. 5, nr.4, pp. 159-161, Apr. 2011, 3 pages.

U.K.Das et al., "The role of back contact patterning on stability and performance of Si IBC heterojunction solar cells", Proceedings of the 40the IEEE Photovoltaic S ecialist Conference, 2014, vol. 1, 4 pages.

* cited by examiner

PHOTOVOLTAIC DEVICE AND METHOD FOR MANUFACTURING THE SAME

This application is the U.S. national phase of International Application No. PCT/EP2021/078719 filed Oct. 15, 2021, which designated the U.S. and claims priority to EP Patent Application No. 20203399.9 filed Oct. 22, 2020, the entire contents of each of which are hereby incorporated by reference.

TECHNICAL FIELD

The present invention relates to the field of photovoltaic devices. More particularly, it relates to a photovoltaic device made of crystalline silicon with back-contacts being of the interdigitated back contact (IBC) type in which the collecting material is patterned, resulting in a device comprising both type of contacts on the back side of the device. The invention also relates to a low-cost method for producing this photovoltaic device.

A particular advantageous application of the present invention is for the low-cost production of highly efficient photovoltaic cells intended for generating electrical energy, but the invention also applies, more generally, to any similar device in which an incoming radiation is converted into an electrical signal, such as photodetectors and ionizing radiation detectors.

BACKGROUND OF THE INVENTION

Interdigitated back-contact silicon solar cells (IBC), while being highly efficient, present difficulties due to their highly complex processing. Indeed, the realization of IBC devices requires localizing or patterning of the semiconducting p- and n-type contacts and of the according conducting contact structures into interdigitated, alternating structures, with a very high accuracy. Most of the techniques known from the state-of-the-art rely on the use of complex and costly processes. Various methods are known to realize the alternating p- and n-type structures. They can be based on localized diffusion methods, mechanical masking technics or even lithographic technics with partial back etch of non-localized depositions.

Recently highest efficiencies have been demonstrated in crystalline silicon IBC cells based on heterojunction contacts.

Examples are described in for example the following publications:
*Interdigitated Back Contact Silicon Heterojunction Solar Cells*, J. C. Stang, Thesis TU Berlin 2018
*Efficient interdigitated back-contacted silicon heterojunction solar cells*, N. Mingirulli et al, *Phys. status solidi-Rapid Res. Lett.*, vol. 5, nr. 4, pp. 159-161, April 2011;
*The role of back contact patterning on stability and performance of Si IBC heterojunction solar cells*, U.K.DAS et al., Proceedings of the 40 the IEEE Photovoltaic Specialist Conference, 2014, vol. 1;

A document U.S. Pat. No. 6,274,402B1 describes a typical example of a device requiring two patterning steps and is based on an insulating layer between the n- and p-fingers. The manufacturing process of the device described in U.S. Pat. No. 6,274,402B1 is complex and expensive.

Several attempts have been undertaken in the past to reduce the cost of IBC-HJT devices. For example, in document EP1519422B1 it has been proposed to pattern only a first silicon layer which is an n-doped layer or a p-doped layer, i.e., an electron- or a hole-collecting structure. A second silicon layer of a second type is, in these devices, deposited on top of the patterned charge-collecting structures. The resulting device is called a "tunnel junction IBC-HJT device". Compared to techniques wherein the two types of charge collectors have to be patterned, such a process flow results in a simpler process, because the second silicon layer, which is of the opposite doped type with respect to the doped type of said first silicon layer, forms a self-aligned collecting structure. Although the fabrication process of such devices is simpler than the ones in which both of the charge carrier collecting types are structured, such as for example in the case of the device described in U.S. Pat. No. 6,274,402B1, the structuring and aligning processes to realize the contacting structures remains complicated and expensive to realize.

Known processes for realizing contact structures of IBC type or IBC-HJT devices are for example based on a plating process, demanding for multiple process steps, as shown in U.S. Pat. No. 9,362,426. Such a process is lengthy and expensive and at the present state of knowledge no simpler and less expensive.

The document US 2015/0280029 describes a back-contact, back junction solar cell, wherein a junction is formed by the P and N interface. The junction is a region of high recombination and must be removed by the formation of trenches between the P and N regions. The trenches must be realized in the silicon (Si) layer at the back side and requires to realize a passivation of the trenches in order to maintain a high efficiency. A subsequent metallization step has to be performed of the active semiconductor and the metal layer has subsequently to be patterned and isolated between the P and N regions. Chemical etching is preferably used to pattern the metal layer and the patterning of the Si layer. The sequence of Si trench formation, masking, etching, contact opening, metal isolation to form an IBC cell is a tedious and complex process.

Another document US 2019/237608A1 describes a process to realize an IBC solar cell. The process described in US 2019/237608A1 is complex, with 4 to 6 different etching steps. Each etching step implying the deposition of a patterned resist layer, the etching process of the non-protected layers and the removing, for example by stripping, of the resist. The multiple steps therefore considerably increase the solar cell cost because of a higher operational cost and a reduction in the production yield and would not allow to provide cheap and efficient IBC devices.

There is thus a need for a more simplified process to realize conducting contact structures that should be less expensive while at the same time assuring high reliability and possibly improved efficiency.

SUMMARY OF THE INVENTION

The present invention relates to a photovoltaic device which allows to alleviate the disadvantages of the prior art. In particular the invention allows to provide a considerable simplification of the back-end process flow of an IBC solar cell by using a conductive layer together with the use of conducting compound or paste contacts, where the patterned and interdigitated conducting contact structure is realized by the deposition of only one resin masking layer including apertures of at least two different types, a localized deposition of contact pads and one etch process. In particular, the multiple function of the resin layer, which remains permanently onto the solar cell, allows a strong simplification of the back-end process flow.

In a first aspect, the invention is achieved by a method for manufacturing an interdigitated back contact (IBC) photovoltaic device comprising a substrate defining a plane (X-Y) and, parallel to said plane (X-Y), a longitudinal (A-A) and a lateral (B-B) direction, orthogonal to said lateral direction (A-A) and comprising the steps (A-E) of:

Step A: providing a substrate of a first- or second type doping being an n-type or a p-type doping and having a front side and a back side and realizing on said back side a semiconducting structure comprising individual doped portions of said first type doping and a doped semiconducting structure of a second type, being of the other type than said first type, to provide alternating electrical charge-types of semiconducting contacts.

Step B: realizing a conductive layer on top of doped semiconducting structures

Step C: realizing a patterned isolation resist layer, having a back surface, onto said conductive layer, and so that the formed resist layer comprises resist parts and resist apertures, Step D: apply a plurality of conductive pads onto said resist layer, and so that the conductive pads fill said resist apertures making electrical contact to said conductive layer. Additionally, the conductive pads, by filling said resist apertures, protect the underlying conductive layer against chemical attack in the following etching step.

Step E: etching of the conductive layer in areas specified by apertures in the isolation resist layer to electrically separate first type charge collecting structures F1 from second type charge collecting structures F2. By that electrical separating the conductive layer and the plurality of conductive pads, first type charge collecting structures F1 and second type charge collecting structures F2 are formed.

Conductive pads realized by Step D can also jut out of the resist apertures and facilitate, by jutting out above the surface and/or jutting out of the apertures in X and/or Y direction of the resist, contacting to ribbons or wires for interconnecting individual contact pads of same polarity and between contacts of one polarity of one solar cell to contact pads of the opposite polarity of a second solar cell. Those conductive pads also serve as protective pads to avoid chemical or physical attack of the conductive layer below apertures for example during an etching process effected during further processing.

The proposed process of the invention for establishing the individualized conducting contact structure allows to use only 4 main process steps by depositing a conductive layer or layer stack, depositing an isolation resist layer, depositing the contact pads and an etching step to separate the different type of contacts and to provide a solar cell. Included, even if not mentioned in detail are additional steps like drying and/or curing of the resin layer as well as rinsing and drying steps used in a chemical etching process.

Also, the method of the invention is based on a low-cost deposition of an isolation resist layer. The deposition of the isolation resist layer can be done for example by screen-printing or ink-jet printing.

In embodiments the isolation resist layer can for example be a resin, a lacquer, a printable thermoplastic polymer or the like. The isolation resist layer can be opaque, or at least partially transparent or at least partially reflective in at least a certain predetermined wavelength range.

Furthermore, the isolation resist layer guarantees an electrical separation of conduction wires or ribbons that are used to interconnect pads of one polarity on a first cell and/or contact pads of one polarity of one cell with contact pads of a second cell either having the same polarity for parallel connection or an opposite polarity for series connection.

Furthermore, the isolation resist layer guarantees an electrical separation of conduction wires or ribbons that are used to interconnect pads of one polarity from the pads of the opposite polarity by preventing the electrical contact between the wires or ribbons to the conductive layer underneath.

In an embodiment, said conductive layer comprises at least a transparent conductive oxide layer or at least one metallic layer or a combination thereof.

In an embodiment said transparent conducting oxide (TCO) layer of the conductive layer is made of conductive oxides of one of the materials: Zinc (Zn), Tin (Sn), Indium (In), Tungsten (W), or a combination of them. For higher conductivity those metal oxides can be doped by dopants like Aluminum, Boron, Gallium, Fluorine.

In embodiments, the material of the at least one metal layer is chosen among: Copper (Cu), Silver (Ag), Aluminum (Al), Nickel (Ni), Zinc (Zn), Tin (Sn), Chromium (Cr), Beryllium (Be), Gold (Au) or an alloy thereof.

The conductive layer or layer stack can be deposited by evaporation, sputtering or other known chemical or physical processes using a plasma assisted deposition method like e-beam, ion plating, (PE)-CVD deposition, or a combination of them.

In an embodiment the material of said conductive pads comprises an electrically conducting compound or paste.

Said conductive pads are preferably made of a conductive compound comprising at least one of the materials: Tin (Sn), Silver (Ag), Indium (in), Bismuth (Bi), Copper (Cu), Aluminum (Al), Nickel (Ni). The conductive compound can for example be a soldering paste, low or high temperature sintering pastes, conductive polymers, e.g. epoxy or silicon based filled with metal particles, or the like. The conductive pads can be deposited for example by screen-printing or inkjet printing, or other methods allowing to locally deposit a conductive compound.

In an embodiment the method comprises optionally a step F consisting in the realization of an isolation layer on the back side of the photovoltaic device by filling at least the trenches.

In an embodiment the method comprises, optionally, a step G consisting in the realization of a plurality of additional openings, defined by apertures in the isolation resist layer. Said additional openings, having lateral dimensions may be smaller than 10 µm, for example 2 µm, and having a longitudinal dimension, defined in the length of the openings, that may be as great as the width of the substrate. The openings can have any form, like round, elliptical, square, hexagonal, or star-like holes, lengthy trenches or even a combination of different forms.

Providing holes in the isolation resist and in the conductive layer allows to provide solar cells that may be bi-facial solar cells. Such holes can also improve the increase of electrical current of the solar cell, for example, when using an efficient back reflector such as a white tinted rear foil, arranged for example after the encapsulation in a solar cell module. By using small openings, the etching rates can be slower in the holes, which allows to etch, in the holes, only metals but not or not totally the TCO layer. Keeping the whole TCO layer intact allows to provide efficient electrical carrier collection on one side and at the same time provide sufficient openings to assure bi-faciality and/or back-reflectance of the solar cell.

In an embodiment the method comprises, a Step H consisting in connecting the conductive pads by respective electrically conducting ribbons and/or wires.

These conductors being used to interconnect conductive pads or contacts of same polarity on the photovoltaic device. These conductors can also be used to interconnect conductive contacts of a first polarity of a first device with the conductive contacts of second polarity of a second cell for series interconnection. These conductors can also be used to interconnect contacts pads of a first polarity of a first device with the conductive contacts of a first polarity of a second cell for parallel interconnection.

In a second aspect the invention is achieved by an interdigitated back contact (IBC) photovoltaic device having first-type charge collecting structures and second-type charge collecting structures. The photovoltaic device comprises a substrate comprising a semiconducting structure defining a front surface and a back surface opposite to said front surface, the semiconducting structure comprising, on the back side of the substrate, a first type doped semiconducting structure consisting in a plurality of n- or p-doped portions and a second type doped semiconducting structure, being of the other doped-type of said first-type doped structure, The photovoltaic device comprises further a layer stack arranged on said on the semiconducting structures. The layer stack comprises;
   a conductive layer arranged on said semiconducting structure;
   a patterned isolating resist layer, arranged on said conductive layer, comprising contact apertures and isolation apertures and conducting pads are provided on said resist layer in said contact apertures where the contact pads electrically contact the conductive layer and can jut out of the contact apertures In the photovoltaic device, trenches are provided in the conductive layer to separate first type charge collecting structures F1 from second type charge collecting structures F2. The trenches are defined by isolation of apertures realized in the isolation layer. The trenches have a depth extending from the back surface of said patterned isolating resist layer to said first or second-type doped semiconducting structures.

In an embodiment, said conductive layer comprises at least one transparent conductive oxide (TCO) layer or at least one metallic layer or a combination thereof.

In an embodiment, said trenches comprise a succession of openings of the different layers of said layer stack.

In an embodiment, the lateral width of the opening in said at least one transparent conductive oxide (TCO) layer is smaller than any of the lateral widths of the layers of said conductive layer.

In an embodiment, the lateral width of the opening in said at least one transparent conductive oxide (TCO) layer is greater than at least one of the lateral widths of the layer of said conductive layer.

In an embodiment, said conductive layer comprises on said at least one transparent conductive oxide (TCO) layer, and at least one of: a metallic layer, a second metallic layer, an additional metallic layer.

In an embodiment, said additional metallic layer is in contact with said at least one transparent conductive oxide (TCO) layer.

In an embodiment, the lateral width of the opening in said at least one transparent conductive oxide layer is smaller than at least one of the lateral widths of the openings of the layers of said conductive layer.

In an embodiment, the lateral width of the aperture in said additional metallic layer is smaller than the lateral width of the aperture in said at least one metallic layer.

In an embodiment, the invention is achieved with an IBC photovoltaic device, where the semiconducting structures provide a heterojunction contact with the crystalline silicon substrate.

In an embodiment, the invention is a tunnel-junction heterojunction type IBC photovoltaic device, where the first type doped semiconducting structures are locally deposited on the back side of the cell and the second type doped semiconducting structure is deposited on the back side of the device by at least partially covering also the first type doped semiconducting structures. With this process a tunnel-junction is established in the contact zones of first and second type doped semiconducting structures.

In an embodiment an additional protective layer is deposited on top of the resin layer at least in areas of the trenches that separate first type charge collecting structures F1 from second type charge collecting structures F2. In an advantageous implementation of the invention the protective layer is deposited on the full back side of the photovoltaic device with a thickness that allows electrical through-contacting of the contact pads via the protective layer. The protective layer may be for example a SiN layer.

In an embodiment, the interdigitated back contact IBC photovoltaic device 1 comprises a plurality of openings extending from the resist layer back surface to at least a predetermined depth d2 in said conductive layer, said openings, having lateral dimensions in directions x, y between 2 um and the overall dimension of the wafer substrate and can have any form, like round, elliptical, square, hexagonal, or star-like holes, lengthy trenches or even a combination of different forms In an embodiment, at least two interdigitated back contact (IBC) photovoltaic cells are interconnected by conductors. The conducting pads of the first type of the first cell are connected to conducting pads of the first type of the second cell for parallel interconnection or to second type of the second cell for series interconnection.

BRIEF DESCRIPTION OF THE DRAWINGS

The present invention will now be described in reference to the enclosed drawings where:

FIG. 1 and FIG. 6 illustrates electrical contacts and the projection of charge collecting fingers in a horizontal plane of an isolation layer at the backside of a device of the invention.

In FIG. 3, and FIGS. 4a-d, second charge type collecting fingers are illustrated as dashed lines because they are in a parallel plane different than the one of the FIGS. 3, 4.

FIGS. 4a-4d illustrate vertical cross-sections of embodiments of the device according to the invention.

FIG. 6 illustrated a top view of the back side of a device according to the invention and illustrates a horizontal layout of conducting pads that face the n-type and p-type charge collectors. FIG. 6 illustrates the projection of charge collecting fingers in a horizontal plane of an isolation layer at the backside of a device according to the invention.

DETAILED DESCRIPTION

Figure 1:
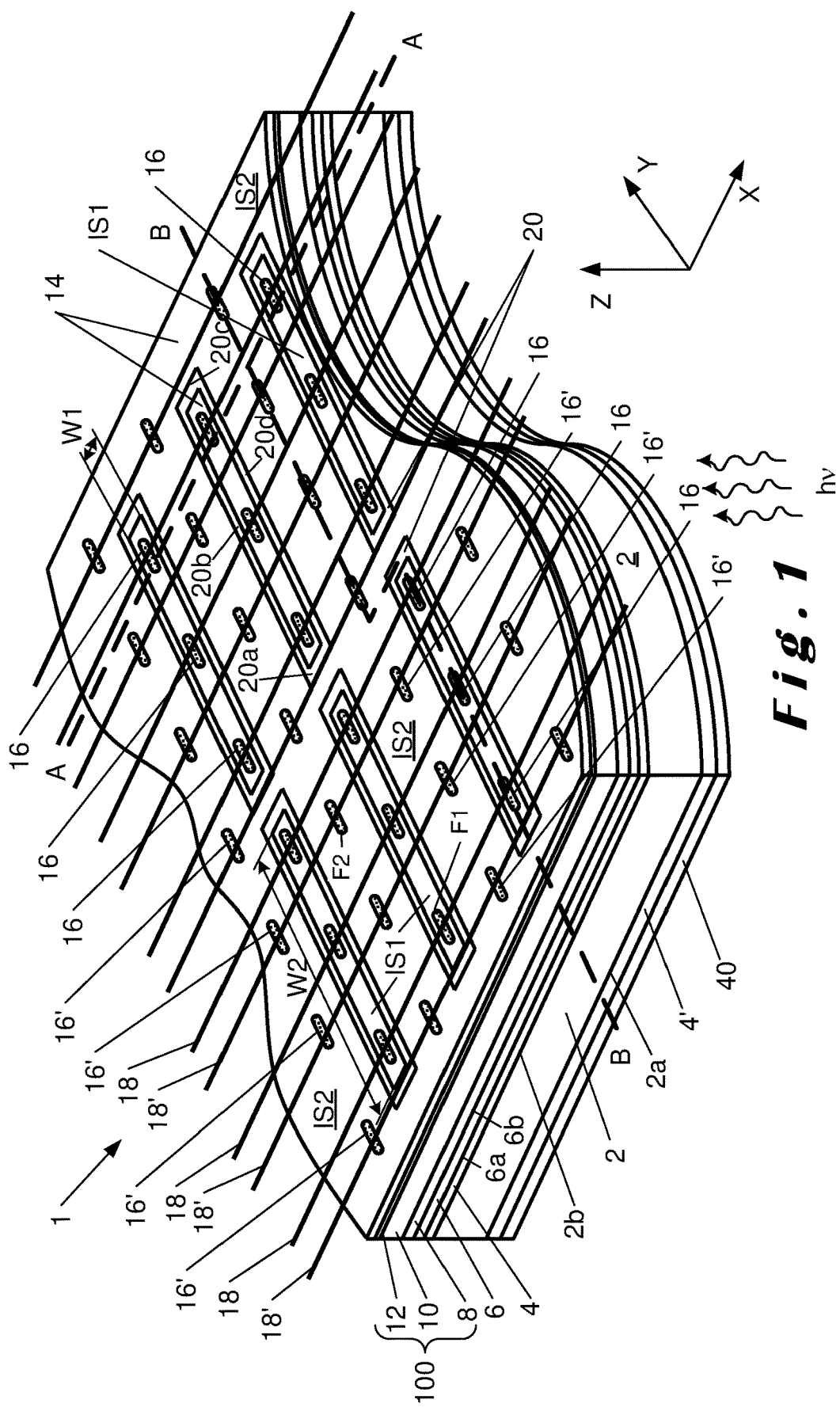
FIG. 1 illustrates a perspective view of a realized junction IBC device according to the invention. The silicon wafer texture has been removed in the Figures for clarity but is obviously present in a real device.

The present invention will be described with respect to particular embodiments and with reference to certain drawings, but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to the practice of the invention.

It is to be noticed that the term "comprising" in the description and the claims should not be interpreted as being restricted to the means listed thereafter, i.e. it does not exclude other elements.

Reference throughout the specification to "an embodiment" means that a feature, structure or characteristic described in relation with the embodiment is included in at least one embodiment of the invention. Thus, appearances of the wording "in an embodiment" or, "in a variant", in various places throughout the description are not necessarily all referring to the same embodiment, but several. Furthermore, the features, structures or characteristics may be combined in any suitable manner, as would be apparent to a skilled person from this disclosure, in one or more embodiments. Similarly, various features of the invention are sometimes grouped together in a single embodiment, figure or description, for the purpose of making the disclosure easier to read and improving the understanding of one or more of the various inventive aspects. Furthermore, while some embodiments described hereafter include some, but not other features included in other embodiments, combinations of features if different embodiments are meant to be within the scope of the invention, and from different embodiments. For example, any of the claimed embodiments can be used in any combination. It is also understood that the invention may be practiced without some of the numerous specific details set forth. In other instances, not all structures are shown in detail in order not to obscure an understanding of the description and/or the figures.

A horizontal plane herein is defined as a X-Y plane parallel to a face of the substrate 3. The wording "horizontal cross section means a cross section in a X-Y plane. The wording "vertical means" here perpendicular to the substrate and defines a Z-axis. A vertical cross section is a cross section in a X-Z or Y-Z plane that comprises the vertical axis Z. A radial direction means a direction defined in a horizontal cross section. A lateral direction is defined in an X and/or Y direction in a horizontal plane.

A longitudinal direction is defined as being a direction substantially in the length of conducting wires, the conducting wires not being necessarily straight wires but may have a sinusoidal shape or comprise curves or steps. A lateral direction is defined as being a direction orthogonal to the longitudinal direction. Conducting wires extend mainly in said longitudinal direction and so have a much larger extension in the longitudinal direction (A-A in the figures) than in the lateral direction (B-B in the Figures).

A width is defined as a width of a structure across a virtual line in a horizontal plane, said width is also defined as a diameter. Thicknesses are defined herein as thicknesses in the vertical Z-direction.

The term "full area layer" used herein is defined as a layer deposited on a whole surface, for example of a whole substrate 3.

The term "contact aperture" is used herein to define apertures configured to introduce at least a portion of an electrical conductive layer that is used for electrical contact purposes.

The term "isolation aperture" means an aperture to isolate adjacent electrically conductive layers or electrically conductive layer portions.

The term "lateral width of an opening" is defined in a horizontal X-Y plane and perpendicular to the length of that opening. A longitudinal width of an opening means a width defined in the length of an opening, the length being defined perpendicular to said lateral width.

The invention provides an IBC solar cell 1, such as a crystalline silicon IBC photovoltaic devices that can be produced with a low-cost process especially in high volume production machines. IBC cells as described herein comprise also IBC cells comprising a tunnel junction.

In a first aspect the invention is achieved by a method for manufacturing an interdigitated back contact (IBC) photovoltaic device 1 comprising a substrate 2 defining a plane (X-Y) and, parallel to said plane (X-Y), a longitudinal (A-A) and a lateral (B-B) direction, orthogonal to said lateral direction (A-A) and comprising the steps (A-E) of:

Step A: providing a substrate 2 of a first- or second type doping being an n-type or a p-type doping and having a front side 2a and a back side 2b and realizing on said back side 2b a semiconducting layer, defined also as a semiconducting structure 6, comprising individual doped layer portions 6' of said first type doping and a doped semiconducting layer portions 6" of a second-type, being of the other type than said first type, to enable to make alternating types of semiconducting contacts. The semiconducting structure 6 has a bottom surface 6a and a top surface 6b opposite to said bottom surface 6a.

Figure 2:
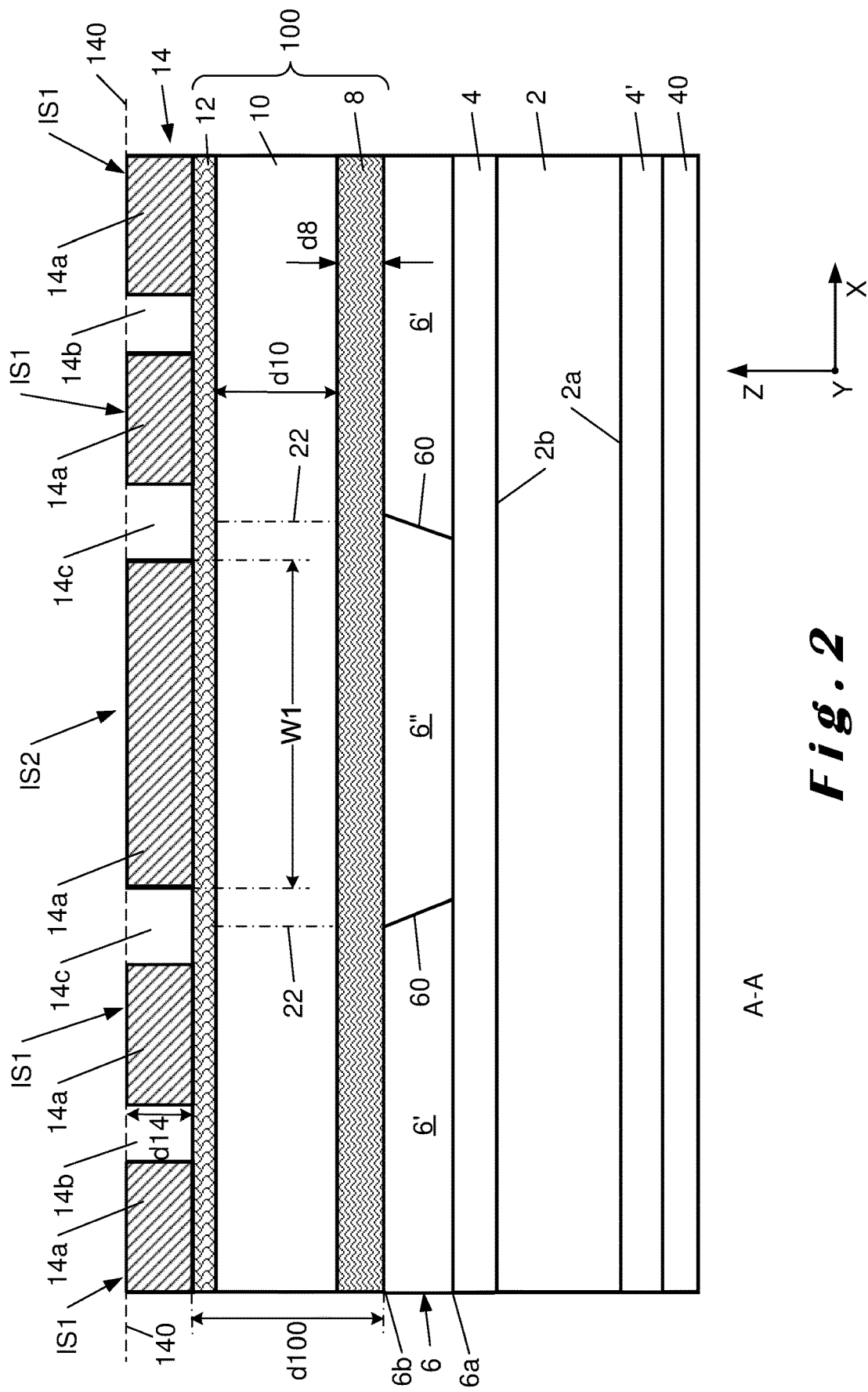
FIG. 2 illustrates the realization of a patterned isolation resist on a stack of layers on top of semiconducting contact structures.
Figure 3:
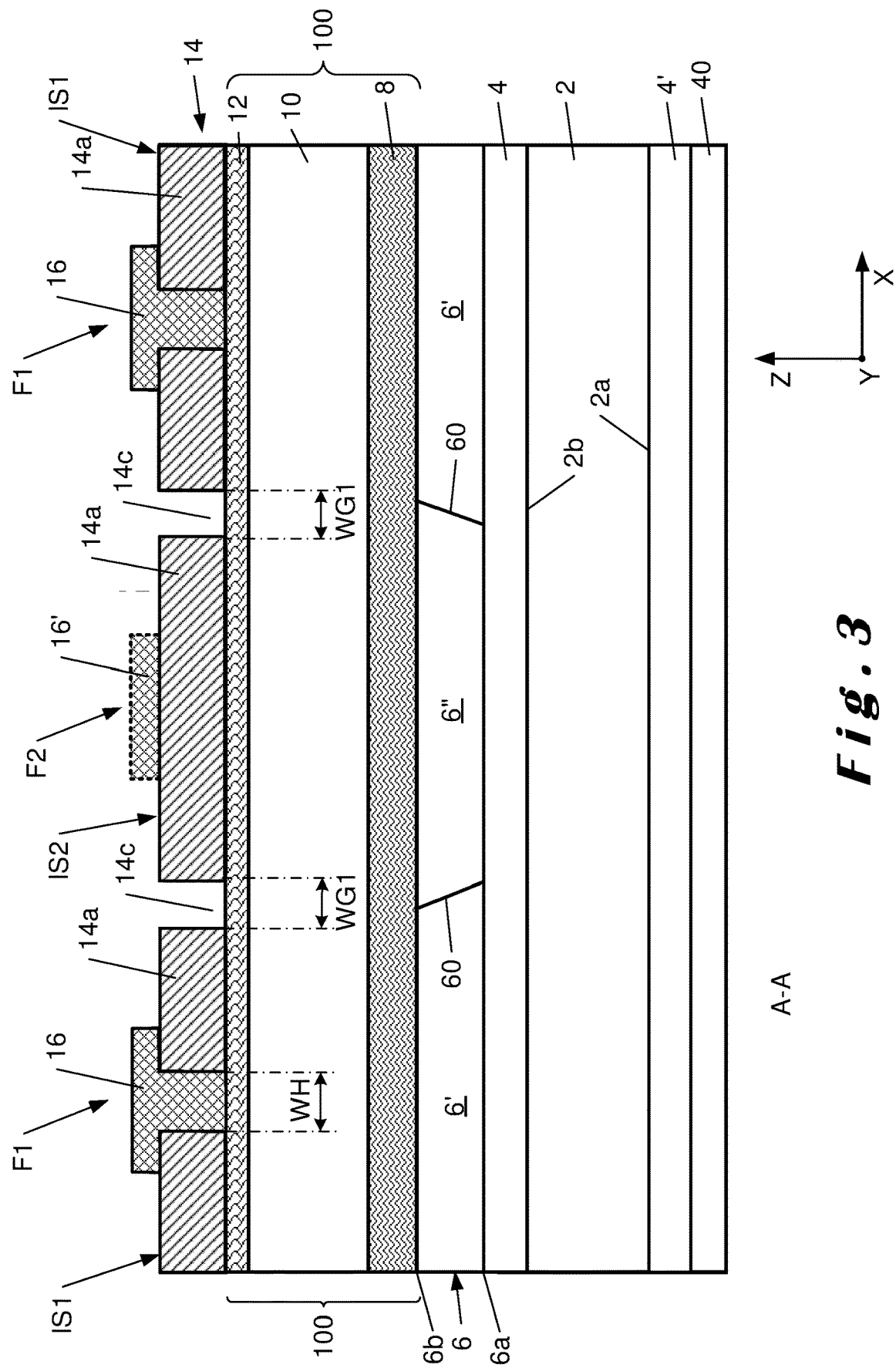
FIG. 3 illustrates a conducting compound deposited into resin apertures 14b and on the patterned isolation resist of FIG. 2.
Figure 4A:
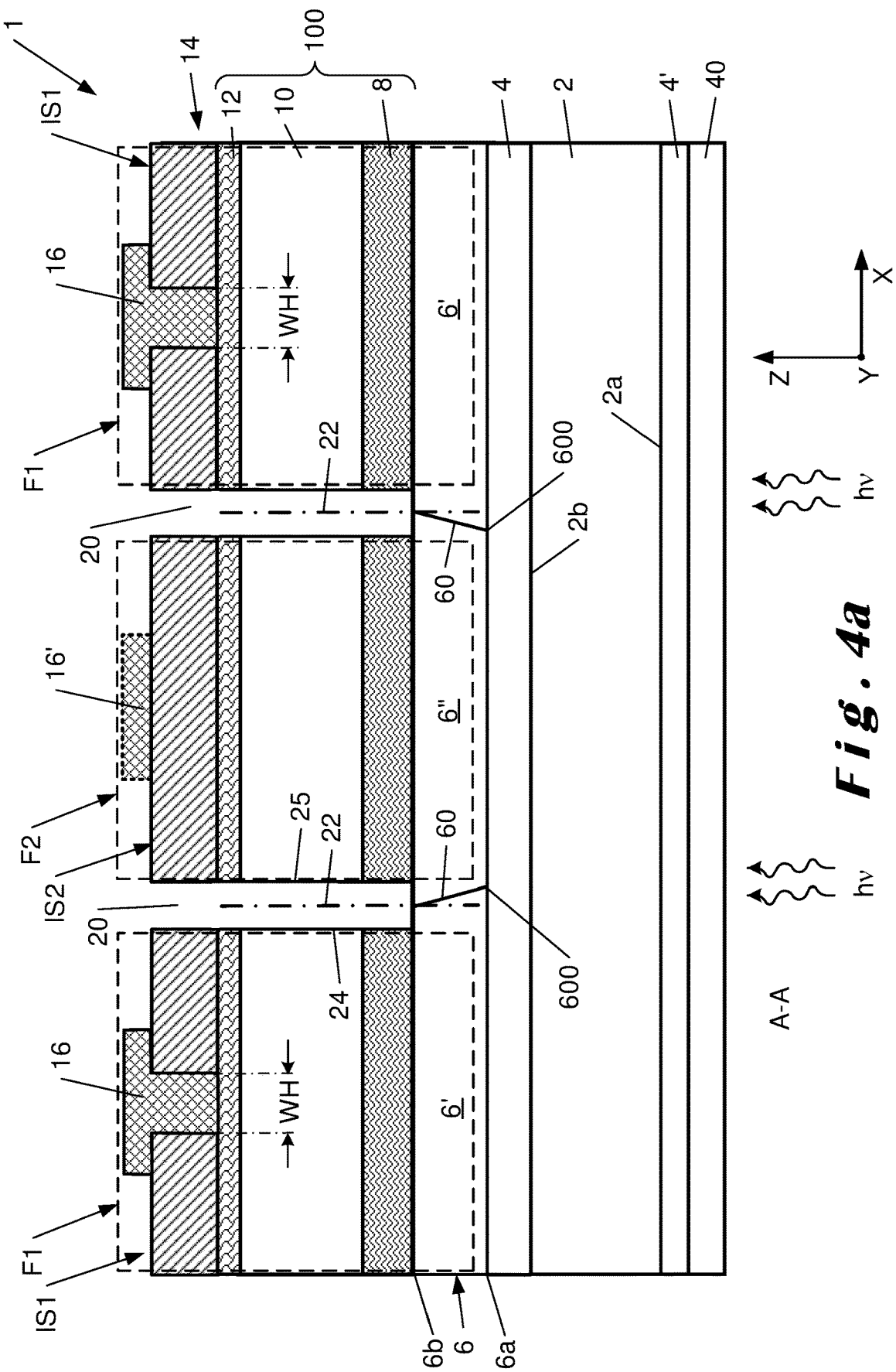
Figure 4B:
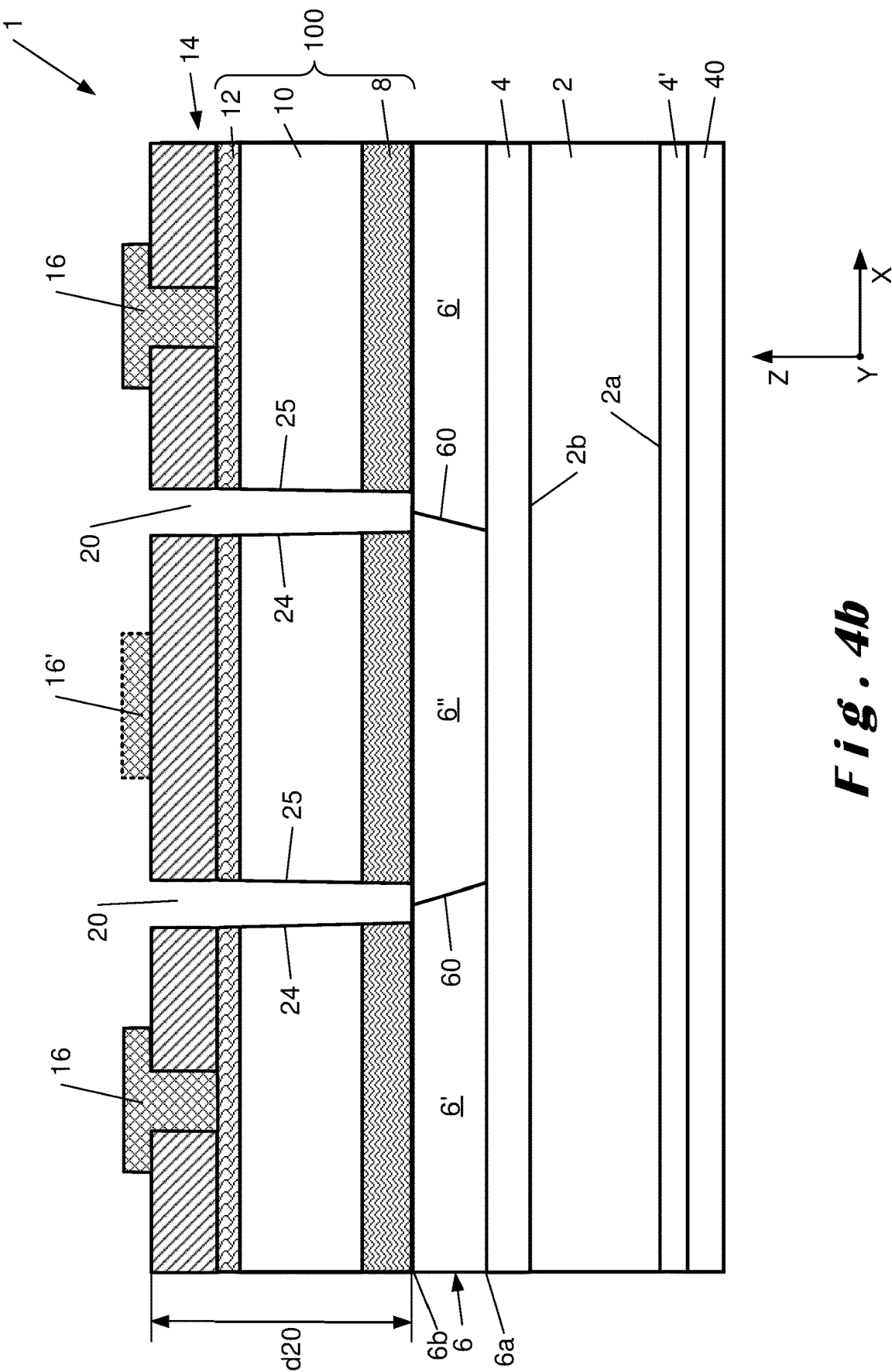
Figure 6:
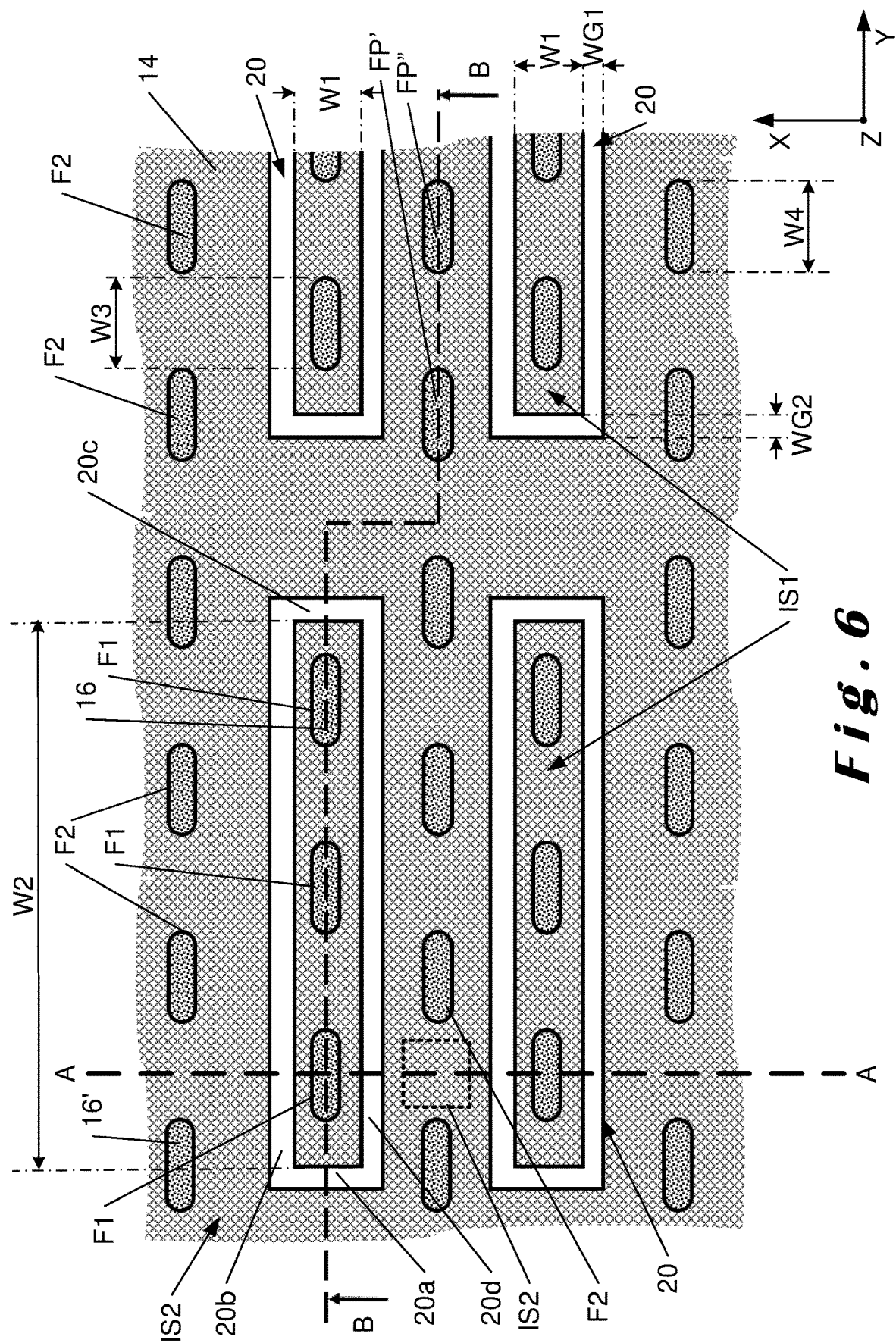
Figure 7:
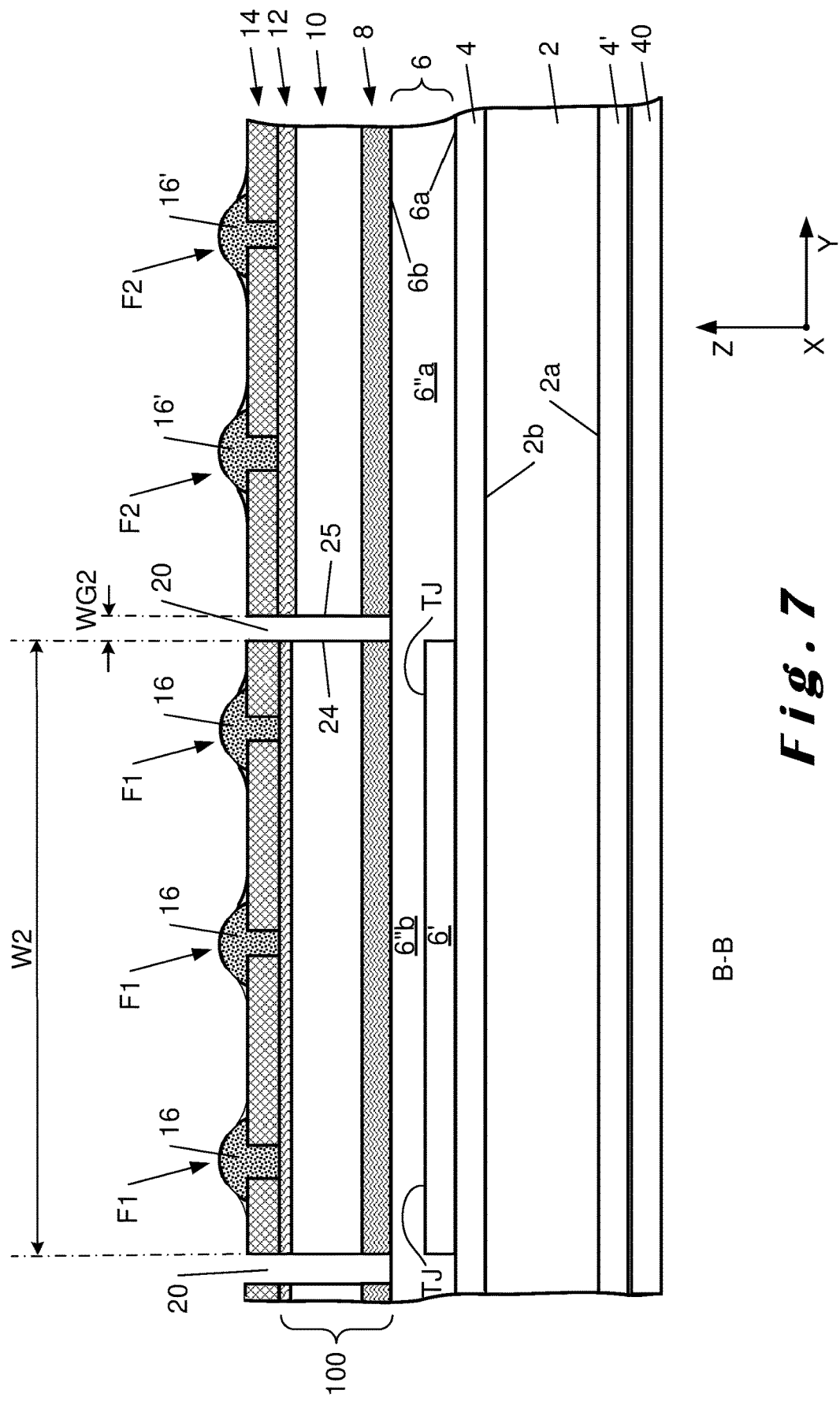
FIG. 7 illustrates a vertical cross section of a device according to FIG. 3 along a lateral (B-B) cross-section as illustrated in FIG. 6 comprising a tunnel-junction.
Figure 8:
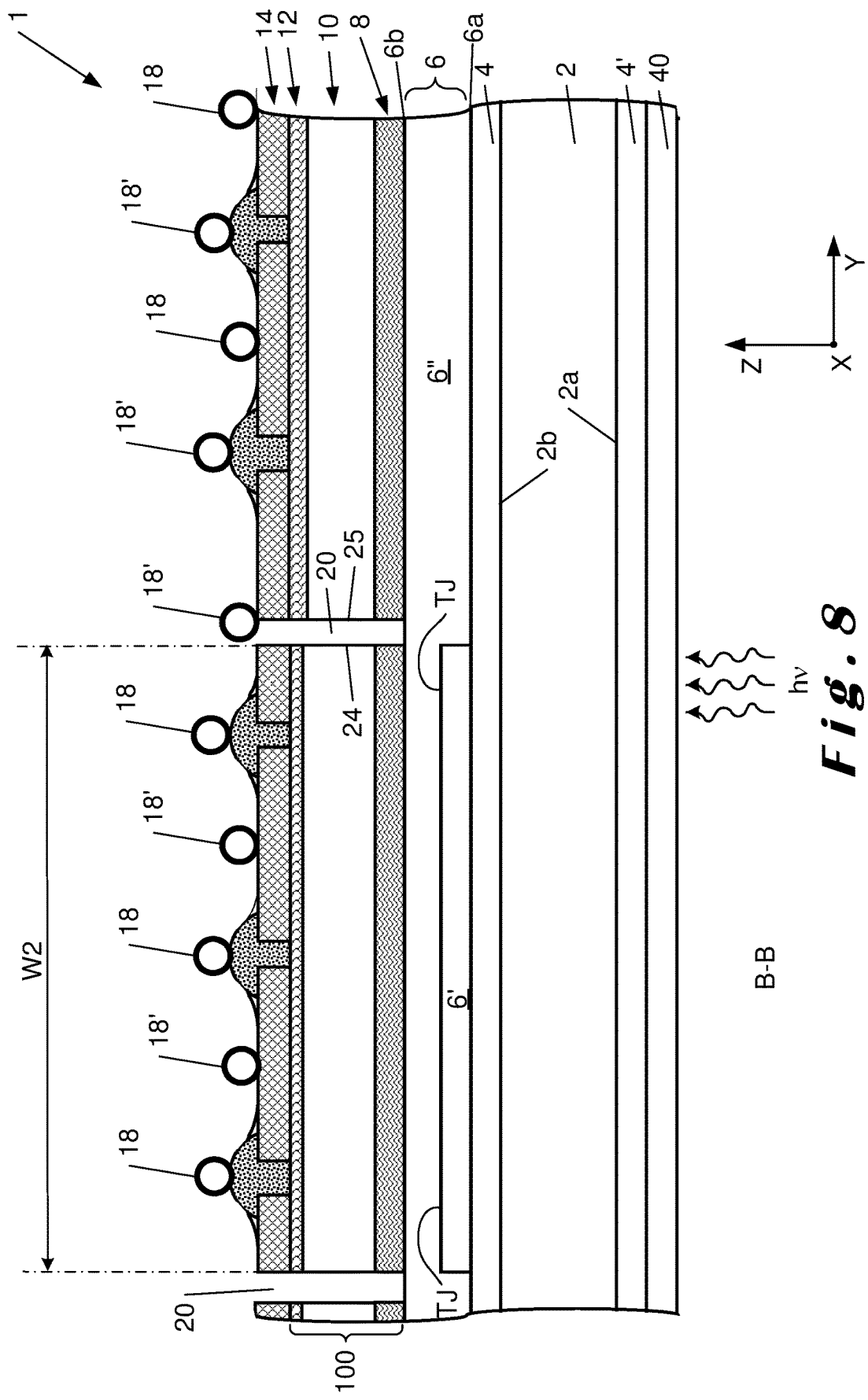
FIG. 8 shows a lateral and vertical cross section of a device comprising a tunnel junction and illustrates the alignment of conducting wires arranged onto the conducting pads.
Figure 9:
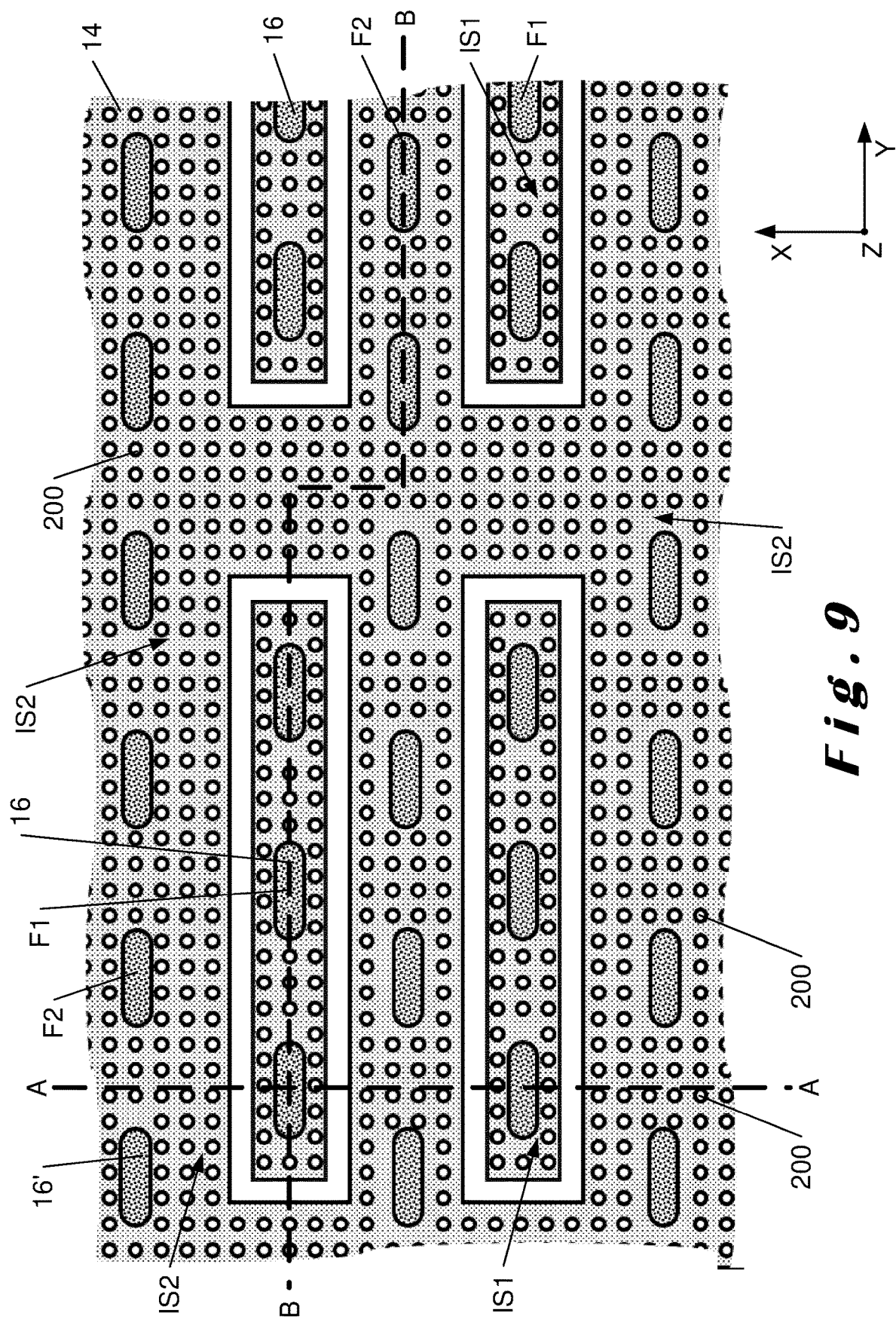
FIG. 9 illustrates an isolation resist layer comprising an array of apertures.

Step B: realizing a conductive layer 100 on top of the doped semiconducting structures 6' and 6";

Step C, illustrated in FIG. 2: realizing a patterned isolation resist layer 14, having a back surface 140, onto said conductive layer 100, and so that the formed resist layer comprises resist parts 14a and resist apertures 14b, 14c, Step D, illustrated in FIG. 3: apply a plurality of conductive pads 16, 16' onto said resist layer 14, and so that the conductive pads 16, 16' fill said resist apertures 14b making electrical contact to said conductive layer 100. FIG. 3 illustrates second type conductive pads 16' as dashed lines as projected onto the plane of the FIG. 1. In reality second type conductive pads 16' are situated in a parallel plane than the one of the FIGS. 3, 4*a-d*. As illustrated in FIG. 4*a*, first type and second type charge collecting structures F1, F2, also defined as charge collecting fingers, are defined as the stack of layers that comprise the conductive pads 16, 16' and the layers that are situated under the conductive pads 16, 16'. Otherwise said, charge collecting structures F1, F2 are a combination of the structured conductive layer 100 in combination with the contact pads. The FIG. 6 illustrates a top view and makes this representation of FIGS. 3, 4 more clear by noticing that second type fingers F2 are not in the plane defined by the A-A section of FIG. 6 and is separated from that plane by the illustrated dashed portion of second type charge collecting areas IS2'

Step E, illustrated in FIGS. 4*a-d*: etching of the conductive layer 100 in areas specified by apertures 14*c* in the isolation resist layer 14 to electrically separate first type charge collecting areas IS1 from second type charge collecting areas IS2. The etching of the conductive layer 100 is performed not further than the top 6*b* of the semiconducting structure 6, i.e. the realized trenches 20 are not extended into the semiconducting structure 6, to the contrary of prior art devices such as described in for example D1 commented in the prior art paragraph herein.

The positioning of the realized trenches 20 is described further in detail for different variants of the IBC cell.

It has to be noted that the process of the invention does not require a passivation layer, or any other layer, on the surface of the trenches 20, to the contrary of some prior art devices such as the one described in US 2015/0280029. The process of the invention provides a considerably simpler process that allows to make also more precise etching and reliable devices. Indeed, the realization of individualized conducting contact structure only requires 4 main process steps by depositing a conductive layer or layer stack, depositing an isolation resist layer, depositing the contact pads and an etching step to separate the different type of contacts and to provide a solar cell. The process is completed preferably by realizing additional steps such like drying and/or curing of the resin layer as well as rinsing and drying steps used in a chemical etching process.

Figure 5:
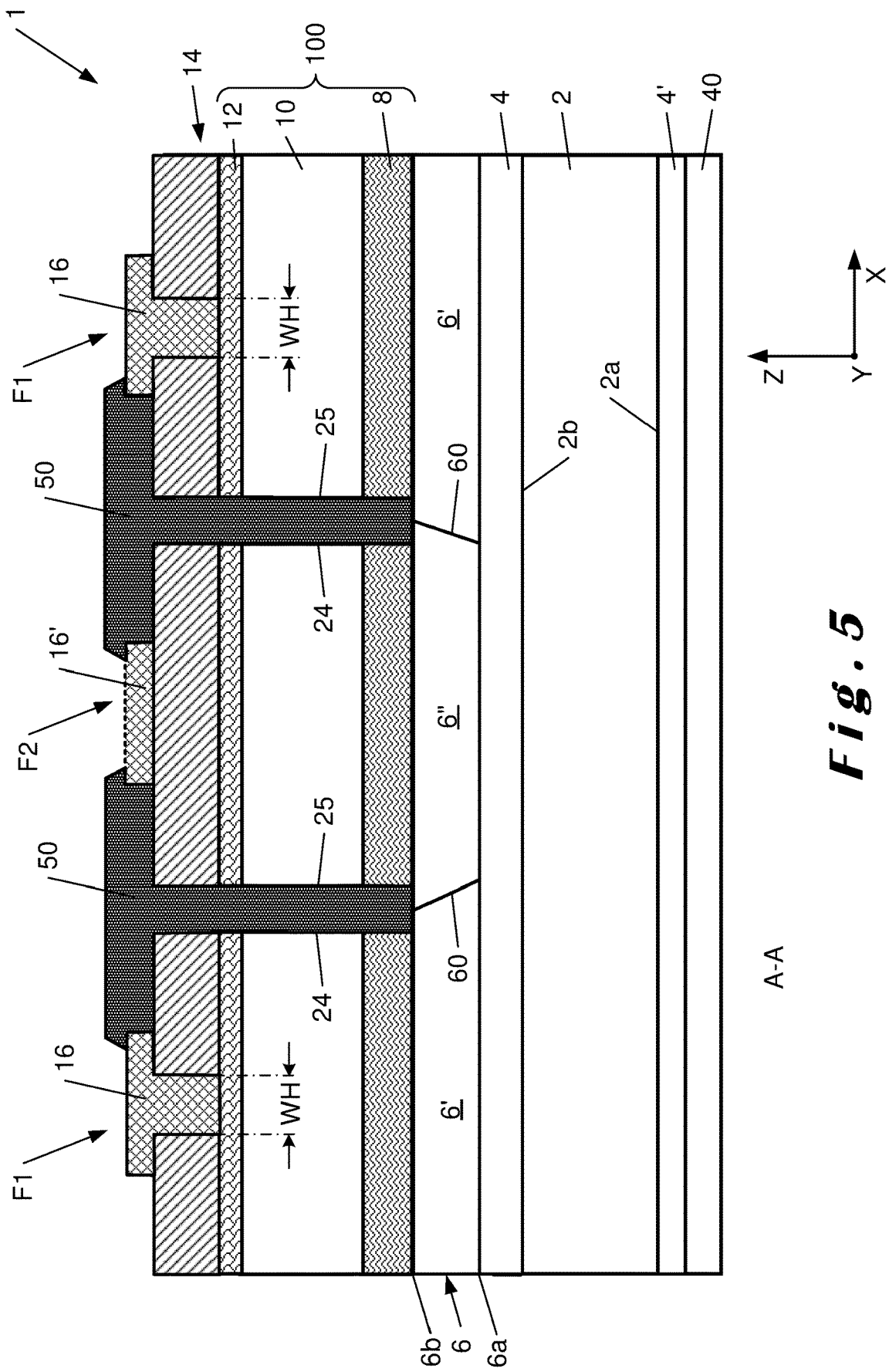
FIG. 5 illustrates an optional version of the invention with an additional insulating layer filling at least the realized trenches.

In variants, illustrated in FIG. 5, an additional insulating layer 50 may be arranged to the cell and filling at least partially the realized trenches 20.

In variants, further described, the conductive layer 100 may be a stack of conductive layers 8, 10, 11, 12.

For example, the conductive layer 100 may comprise a transparent conducting oxide layer 8 and/or a metallic layer 10, defined as first metallic layer, and/or a second metallic layer 12. In variants, the conductive layer 100 may comprise more than 3 different layers. For example, the conductive layer may comprise at least one additional metallic layer 11 arranged between the comprise a transparent conducting oxide layer 8 and said second metallic layer 12 The different layers may have different thicknesses.

The depth d20 of the trenches 20 is at most equal to the sum of the thickness d14 of the isolation layer 14 and the thickness d100 of the conductive layer: dmax≤d14+d100. This to the contrary of prior art approaches such as for example in the device described in US2015/280029A1 wherein the depth of the trenches extends into the doped silicon portions of the substrate.

Figure 12:
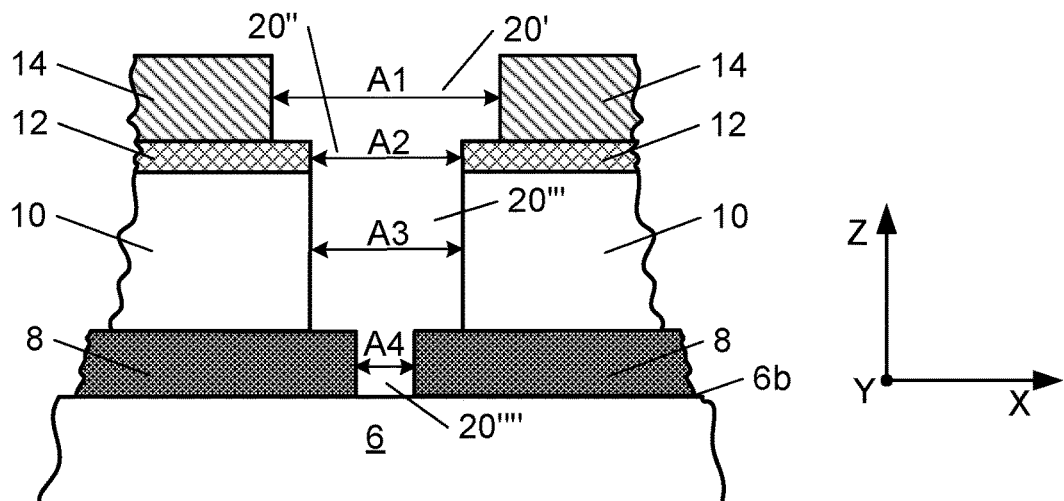
FIGS. 12 to 14 illustrate typical variants of cross sections of apertures in a multilayer structure of a device of the invention.
Figure 13:
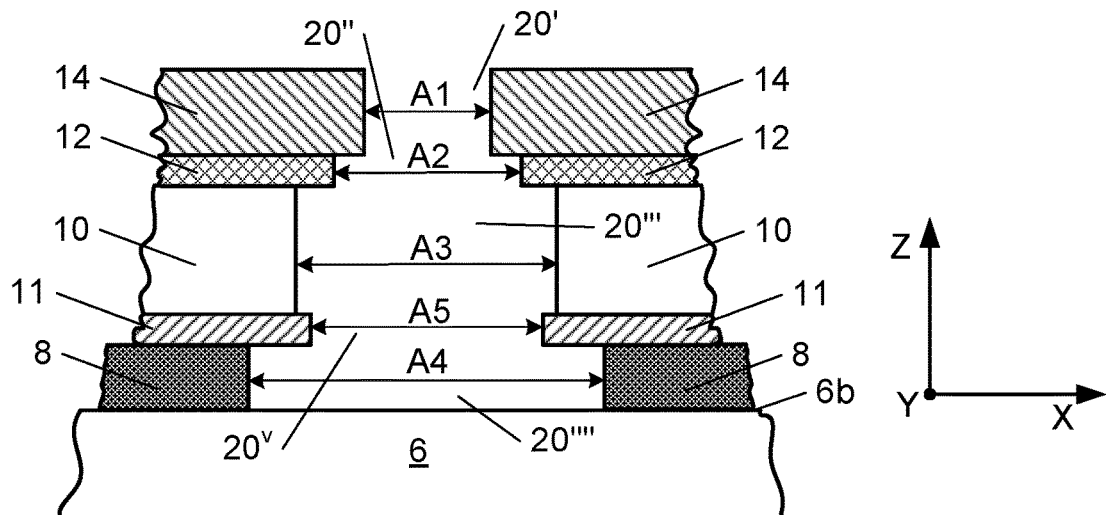
Figure 14:
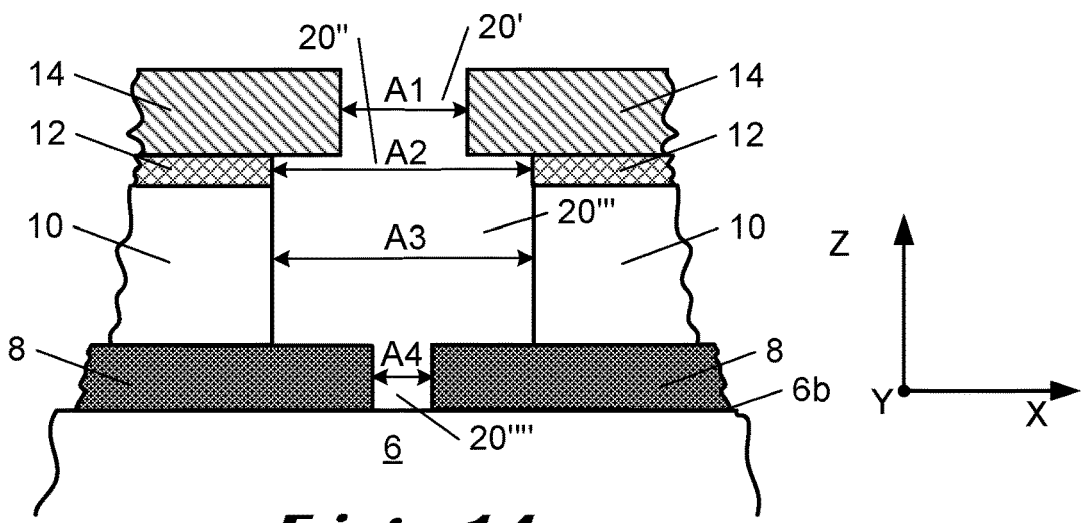

In advantageous embodiments, the trenches 20 can have a different shapes than cylindrical or conical shapes. The trenches 20 may comprise steps, each having different cross sections, defined in different horizontal planes X-Y. FIGS. 12, 13, 14 illustrate possible example of step-shaped trenches 20 formed by the different adjacent apertures 20', 20", 20'", 20'''' of conductive layers 8, 10, 12 and the isolation layer 14. For example, in a realization illustrated in FIG. 12, the lateral widths A1-A4 of the apertures 20', 20", 20'", 20'''' in the isolation layer and the electrically conductive layers, defined in the X-direction, diminish from the isolation layer 14 up to the top surface 6*b* of the semiconducting structure 6.

In another example shown in FIG. 13 opening 20$^V$ the conductive layer 11 has a smaller lateral width A5 than the width A3 of the opening 20''' of the conductive layer 10. This reduced sized aperture 20$^V$ can help to avoid a direct contact between conductive layer 10 and the silicon layer 6. Such a feature is especially beneficial to avoid diffusion of metallic ions like Aluminum or Copper stemming from conductive layer 10 into the silicon layer 6.

Similarly, in another embodiment the TCO layer 8 has a smaller lateral width in the aperture 20'''' to avoid that said diffusion of metallic ions from conductive layer 10 into the silicon layer 6.

The individual apertures 20', 20", 20'", 20$^{IV}$ of the layers 14, 12, 10, 8, that form said trenches 20, must neither have necessarily straight vertical walls.

In a variant, the conductive pads 16, 16', realized according to the Step D, can also jut out of the contact apertures 14*b* of the resist layer 14 and facilitate, by jutting out above the back surface 140 and/or jutting out of the apertures in X and/or Y direction of the resist layer 14, contacting to ribbons or wires 18, 18' for interconnecting individual contact pads of same polarity and between contacts of one polarity of one solar cell to contact pads of the opposite polarity of a second solar cell. Those conductive pads 16, 16', also serve as protective pads to avoid chemical or physical attack of the conductive layer below the contact apertures 14*b* for example during an etching process effected during further processing.

The substrate 2 can comprise to each side 2*a*, 2*b* a buffer layer 4, 4'. These buffer layers 4, 4' are used as passivation layers on the silicon substrate 2 to reduce the recombination rate at the silicon surface. Those buffer layers 4, 4' can be chosen and adapted to its particular tasks. For example, the buffer layer 4', being deposited on the front side of the solar cell, can be of high transparency T (T>60% or T>80% in the visible and/or the infrared part of the electromagnetic spectrum). The buffer layer 4' at the front side doesn't necessarily need a high carrier transfer efficiency. For this purpose, for example, a hydrogenated amorphous silicon a-Si:H, a hydrogenated SiO, SiC, SiN or AlOx layer can be used. Such layers are typically intrinsic or only slightly doped for most efficient passivation effects. On the rear side the optional buffer layer 4 can advantageously be a highly transparent passivation layer that also efficiently can transfer electric charges. For this purpose, intrinsic amorphous silicon layers are preferred choices. In variants, only slightly doped hydrogenated amorphous silicon layers can be used, but in principal any layer that can offer above mentioned features can be used for this purpose. Slightly doped hydrogenated amorphous silicon means a dopant concentration below $10^{19}$ $cm^{-3}$.

On the front side (i.e., the incident light side) of the IBC device 1, an additional second layer 40 can be deposited on top of the buffer layer 4', to further improve the efficiency of the device by reducing the reflection of light at the interface between the photovoltaic device and its surrounding material.

The semiconducting contact structures of opposite polarities can be established by different processes, like localized diffusion, full surface doping processes and latter localized chemical or physical back etch using removable masks or by laser removal.

Also, localized deposition of doped silicon layers can be used to realize the alternating type of semiconducting contact structures.

An advantageous variant of the latter technology can be realized by a localized deposition of semiconducting structures of a first type of doping 6' and a non-localized deposition of a semiconducting layer of a second type of doping 6" covering at least partially first doping type structures 6' and by that establishing a tunnel junction at the contact surfaces between structures 6' and layer 6". Those structures being composed of amorphous and/or nano-crystalline silicon.

The deposition of the patterned isolation or resist layer 14 has to be aligned relative to the alternating semiconducting structures 6', 6". The alignment can be done either by using the individual pattern structure as alignment marks or by an additional fiducial mark, established with either of the semiconducting structures 6', 6". The patterned isolation resist layer 14 can be deposited by screen printing, inkjet printing, tampon printing or a similar method. The patterned isolation resist layer 14 has a typical thickness d14 of 1 µm up to 100 µm.

As illustrated in FIGS. 1, 5, 6, said trenches 20 separate first-type charge collecting areas IS1 from second-type charge collecting areas IS2. Trenches 20 may have any horizontal (X-Y) cross section such as a rectangular or elliptical cross section and may have a uniform width. The trenches 20 may also be formed by at least 4 continuous trenches that may have different widths.

The trenches 20 that separate first-type charge collecting areas IS1 from second-type charge collecting area(s) IS2 provide a wide design flexibility of the shape of these areas IS1, IS2. In an exemplary design illustrated in FIGS. 1-11 a first-type charge collecting areas IS1 comprises 3 first type charge collecting fingers F1 for example n-type charge collecting structures, comprising each a conductive pad 16, FIG. 1 illustrates 6 of such first-type charge collecting areas, defined also as first-type charge collecting islands IS1 (n or p-type). The rest of the surface, separated from said first-type charge collecting areas IS1 by said trenches 20, is of the other type p or n-type and constitutes second-type charge collecting areas IS2. Otherwise said, each of the plurality of the first type charge collecting areas IS1 comprise at least one charge collecting structure, to collect electrons or holes, and the remaining areas of the cell comprise a plurality of charge collecting structures to collect the opposite charges. For example, in FIG. 1 the plurality of the first type charge collecting areas IS1 may be plurality of areas comprising each 3 electron collecting charges and the remaining area of the cell, defined as second-type charge collecting area(s) IS2 comprise a plurality of structures to collect holes. The electron and hole collecting structures may have different dimensions in 3D, for example, they may have different widths in one direction, for example the widths W3, W4 in a lateral Y direction as illustrated in FIG. 6. The wording "areas" are projected "areas" and mean here that the underlying structures are also part of it, i.e., a first-type charge collecting areas IS1 comprises all the layers under the area or island IS1.

The typical lateral widths WG1, WG2 of the trenches 20 is between 10 µm up to 1000 µm. These lateral widths are defined as the largest lateral widths of the trenches as projected on a horizontal X-Y plane. Indeed, as further described and illustrated in FIGS. 12-14, the trenches 20 may have, in vertical cross sections, widths that vary in the vertical direction.

Values of each the individual apertures A1, A2, A2, A4, A5 of the isolation layer 14', and the conductive layers 8, 10, 11, 12 may be typically, but not limited to: from 10 µm up to 300 µm.

The trenches 20 are realized by etching back the conductive layer 100 in areas defined by the isolation apertures 14c. The etching can be done by chemical etching in a single step with a chemical solution adapted to etch all of the electrically conductive layer stack 100 at the same time or in multiple steps with chemical solutions adapted to each type of material of conductive layer 8, 10, 11, 12.

In an advantageous example of the invention the etching process is adapted such that at least two of the lateral widths A1-A5 of the openings 20'-20$^V$ of successive layers 8, 10, 11, 12, 14, as described further, are different widths.

In-between the chemical etching procedures rinsing steps can also be used, as well as a final drying step. The chemical etching can be done in a submersion bath or by spraying the chemical etchant on top of the back side of the solar cell. The back etch also can be done in an inline system where the side of the wafer to be etched is only floating on top of the etchant solution. The chemical back etch could also be accelerated by physical means like ultrasonic activation or reverse plating of the conductive layer in the isolation apertures 14c. The back etch of part of conductive layer 100 in the isolation apertures 14c could also be done with physical means like a plasma etch.

In an embodiment, the method comprises a Step F comprising an additional deposition of an additional insulating layer 50 at least in trenches 20. An insulating layer 50 can, for example, be any organic resist layer or an inorganic, dielectric layer like SiOx, SiN or the like. The deposition of the additional isolation layer 50 could be effected by screen printing, inkjet printing or another adapted process for this purpose. A dielectric layer 50 could be deposited by CVD, sputtering, ALD or other technically known methods.

The thickness of an isolation layer 50 can be between 10 nm and 10 µm. The thickness of an isolation layer 50 must not necessarily be uniform over its horizontal plane.

An isolation layer can, especially in the case of a very thin layer, also cover the full back side of the photovoltaic device 1. In the case of very thin layers, also covering the contact pads 16, 16', an electrically conducting contact could be also established with contact ribbons or wires 18,18' through the insulating layer without the necessity to open the layer locally at the contact points.

The invention is achieved also by an interdigitated back contact (IBC) photovoltaic device 1 as realized by the process as described herein. The interdigitated back contact (IBC) photovoltaic device 1 has first-type charge collecting structures F1 and second-type charge collecting structures F2. The photovoltaic device comprises a substrate 2 comprising a semiconducting structure 6 defining a front surface 6a and a back surface 6a opposite to said front surface 6a. The semiconducting structure 6 comprises, on the back side of the substrate 2, a first-type-doped semiconducting structure consisting in a plurality of n- or p-doped portions 6' and a second-type doped semiconducting structure 6", being of the other doped-type of said first-type doped structure.

A layer stack 100, 14, 16 is arranged on said semiconducting structures 6', 6", and comprises:
- a conductive layer 100 arranged on said semiconducting structures 6', 6";
- a patterned isolating resist layer 14, arranged on said conductive layer 100, comprising contact apertures 14b and isolation apertures 14c;
- conducting pads 16, 16' on said resist layer 14 in said contact apertures 14b where the contact pads electrically contact the conductive layer 100 and can jut out of the contact apertures 14b.

The layer stack 100, 14, 16 comprises also trenches 20 that are provided in the conductive layer 100. As illustrated in FIG. 6, the trenches 20, comprise preferably 4 continuous trench portions 20a, 20b, 20c, 20d, to separate electrically the first-type charge collecting structures F1 and the second-type charge collecting structures F2. The trenches 20 comprise said isolation apertures 14c in the isolation resist layer 14. The trenches 20 extend vertically between said back surface 140 to at most the back surface 6b of said semiconducting structure 6.

In embodiments, said conductive layer 100 is a layer stack of at least two conductive layers.

In advantageous embodiments, the conductive layer 100 comprises at least one transparent conductive oxide (TCO) layer 8 or at least one metallic layer 10 or a combination thereof.

In embodiments, said trenches 20 are formed by a vertical succession of openings 20', 20", 20''', 20'''', 20$^V$ of at least two different layers 14, 12, 10, 11, 8 of said layer stack. The openings 20', 20", 20''', 20'''', 20$^V$ may have different lateral widths A1-A5 as explained in embodiments hereafter.

Trenches 20 have preferably, in a horizontal plane X-Y, as illustrated in FIG. 6, a rectangular shaped layout defined by at least 4 continuous trenches 20a, 20, 20c, 20d. The portions 20a, 20, 20c, 20d that form the trenches 20, as illustrated in FIG. 6 must not all have the same lateral width and must not be necessarily straight trenches in their length. For example, opposite portions 20a and 20c of the trenches 20 may have different lateral widths than the 2 other opposite positions 20b, 20d. Trenches 20 may have, in a horizontal plane, other shapes such as an oval shape or hexagonal shape or any other 2D-shape.

In embodiments, illustrated in FIG. 13, the lateral width A4 of the opening 20'''' in said at least one transparent conductive oxide (TCO) 8 is greater than the lateral widths A2, A3 of the metallic layer 10 or the second metallic layer 12 of said conductive layer 100.

In embodiments, the lateral width A4 of the opening 20'''' in said at least one transparent conductive oxide (TCO) 8 is smaller than any of the lateral widths of the layer of said conductive layer 100. For example, in the embodiment of FIG. 14, the lateral width A4 of the opening 20'''' in said at least one transparent conductive oxide (TCO) 8 is smaller than the lateral widths of the metallic layer 10 and the second metallic layer 12.

In embodiments, illustrated in FIG. 13, said conductive layer 100 comprises on said at least one transparent conductive oxide (TCO) 8, and in successive order from at least one transparent conductive oxide (TCO) 8: at least one additional metallic layer 11, a first metallic layer 10 and a second metallic layer 12. The additional layer may be a layer of silver (Ag). The second metallic layer (12) may be a layer of copper (Cu).

In embodiments, illustrated in FIG. 13, the lateral width A5 the opening 20$^V$ of said additional metallic layer 11 is greater than the lateral width A2 of said second metallic layer 12. In variants, not illustrated, the lateral width A5 the opening 20$^V$ of said additional metallic layer 11 is smaller than the lateral width A2 of said second metallic layer 12.

The central virtual axis 22 of the trenches 20 is preferably aligned with the center of the separation interface 60 between the two different doped areas 6', 6". But in variants, illustrated in FIG. 4a, the central virtual axis 22 may be vertically aligned to the lower or upper border of said interface 60. In variants, such as illustrated in for example FIG. 4a, a lateral border 25 of the trenches 20 is aligned with a lower border 600 of said separation interface 60.

FIGS. 4a-4d are variants illustrating different, not exclusive, versions of arrangements of doped portions 6' of said first type doping and doped semiconducting structure 6" of a second-type doping.

Figure 4C:
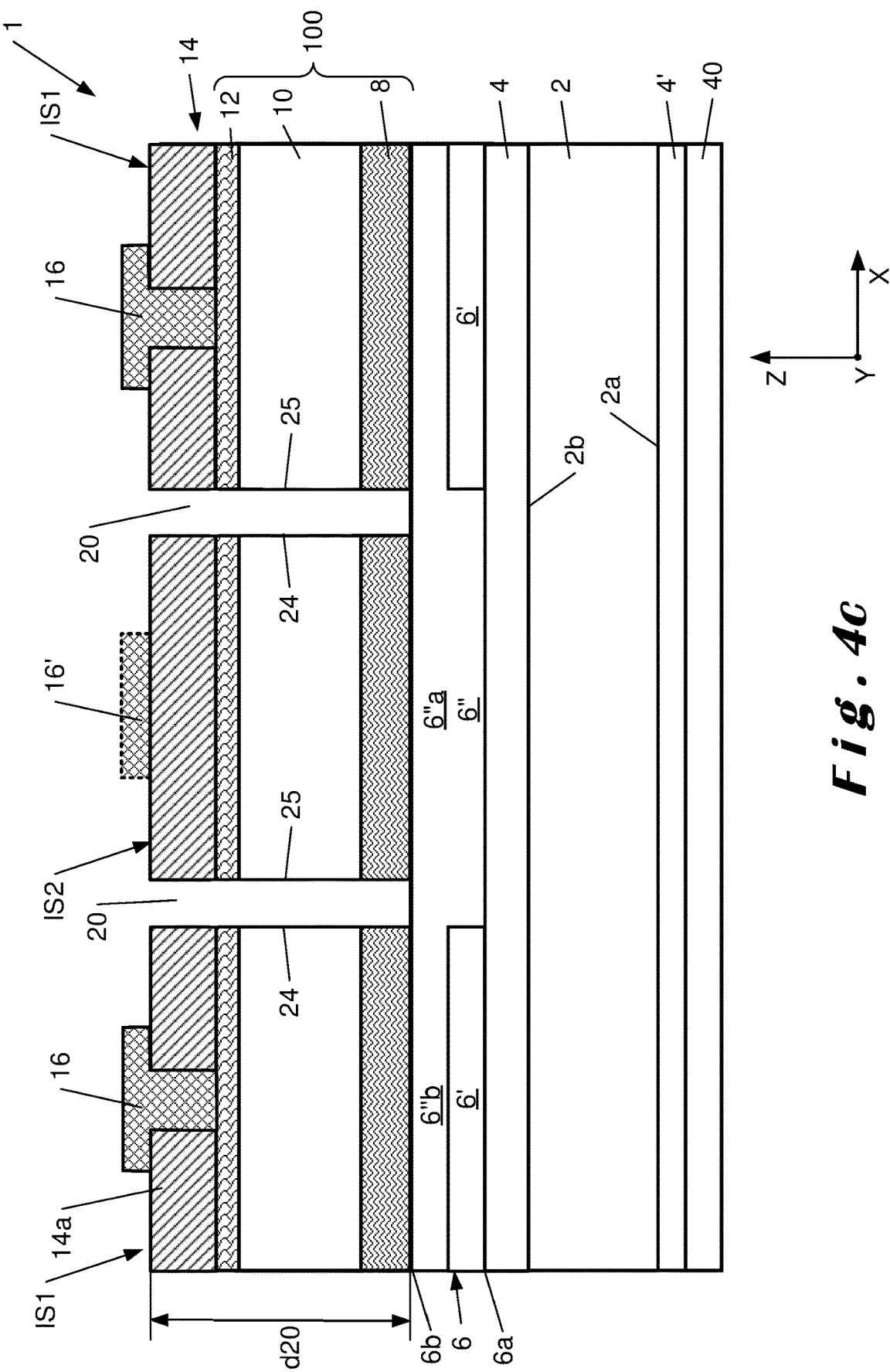
Figure 4D:
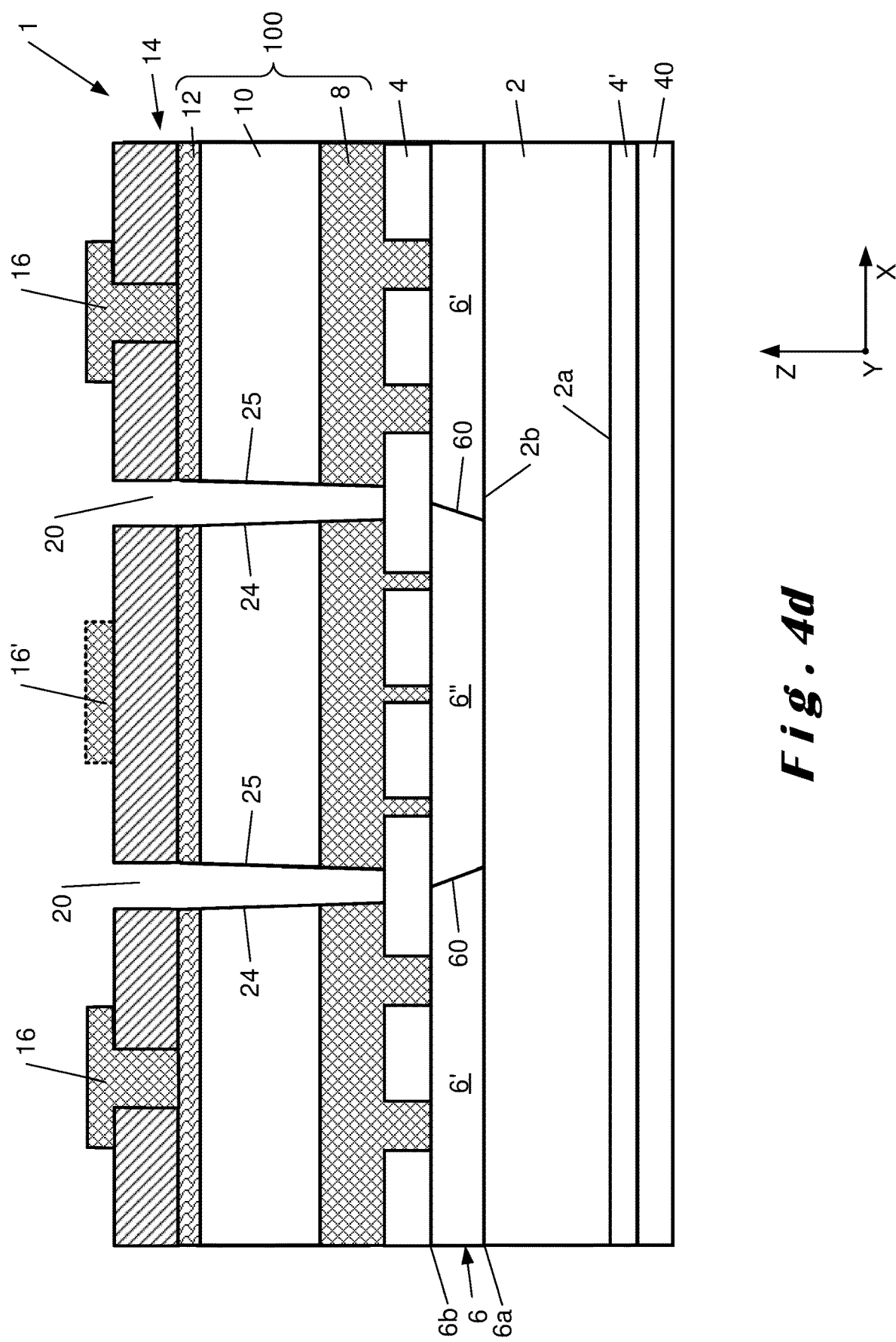

For example, in the variant of FIG. 4d, a patterned buffer layer 4 is arranged onto the doped semiconductor layer 6.

FIGS. 4a-4d and illustrate also different types of interfaces 60 between these doped layer portions 6', 6". Interfaces 60 may be vertical (i.e., in the Z-direction) or interfaces making an angle with the vertical direction. Interfaces 60 may be curved interfaces.

In the case of an IBC cell 1 comprising a tunnel junction, as illustrated in the cross section of FIGS. 4c, 7, 8, 10, 11, the central virtual axis 22 is preferably aligned, preferably within a margin of some micrometers, with the border of the individual doped portions 6' of said first type doping. In variants, illustrated in for example FIG. 8, lateral borders 24, 25 of the trenches 20 is vertically aligned, within some micrometers, with the border of the individual doped portions 6' of said first type doping.

It is understood that the lateral borders 24, 25 of the trenches 20 are configured such that there is an electrical separation of neighboring charge collection areas IS1 and IS2 of different type, like hole and electron collecting areas.

In embodiments, illustrated in FIG. 6, trenches 20 may have different lateral widths WG1, WG2 around at least one of said first doped areas IS1.

In an embodiment, illustrated in FIGS. 2-5, 7, 8, 10, 11, said conductive layer 100 comprises at least one transparent conductive layer or at least one metal layer or a combination thereof. More precisely, the conductive layer 100 may be one of the following exemplary combinations, without excluding other variants: only a TCO layer, only a metal layer, a TCO-metal stack, a TCO/metal/metal stack. In variants the conductive layer 100 does not comprise a TCO layer at all.

The conductive layer 100 could also be made of a conducting organic layer, i.e. PEDOT:PSS, with or without conducting additives as carbon nanotubes or silver nanowires.

In variants of said conductive layer stack 100, its different layers may have different thicknesses.

A typical thicknesses d100 of said conductive layer 100, possibly being a conductive layer stack, is preferably between 50 nm-10000 nm, more preferably between 100 nm-10000 nm.

In an embodiment, said transparent conducting oxide (TCO) layer of the conductive layer 8 is made of conductive oxides of one of the materials: Zinc (Zn), Tin (Sn), Indium (In), Tungsten (W), or a combination of them. Said TCO layer can be also a stack of conductive oxides made of different types, for example a stack of ZnO and ITO. For higher conductivity those metal oxides can be doped by dopants like Aluminum, Boron, Gallium, Fluorine. The thickness of the layer 8 can be between 10 to 500 nm, typically 120 nm to increase the reflection in the infrared wavelength region.

In an embodiment, the material of said metal layer or layers is chosen among: Copper (Cu), Aluminum (Al), Nickel (Ni), Silver (Ag), Zinc (Zn), Tin (Sn) Chromium (Cr), Beryllium (Be) or Gold (Au). The thickness of the metal layer 10 is typically between 50 nm to 1000 nm. The thickness of the metal layer 12 is typically between 5 nm to 50 nm.

The conductive layer or conductive layer stack 100 can be deposited by evaporation, sputtering or other known chemical or physical processes using a plasma assisted deposition method like e-beam, ion plating, (PE)-CVD deposition, or a combination of them.

In advantageous embodiments, said conductive pads 16, 16' extend in a lateral (A-A) and/or longitudinal direction (B-B) outside of the contact apertures 14b in isolation layer 14. For example, FIG. 4 illustrates a longitudinal cross-section of a PV cell and illustrates a typical shape of the longitudinal conducting pads of the first type colleting fingers F1. The width of the conducting pads 16, 16' is at least the width WH of the contact apertures 14b in which they are deposited.

Figure 11:
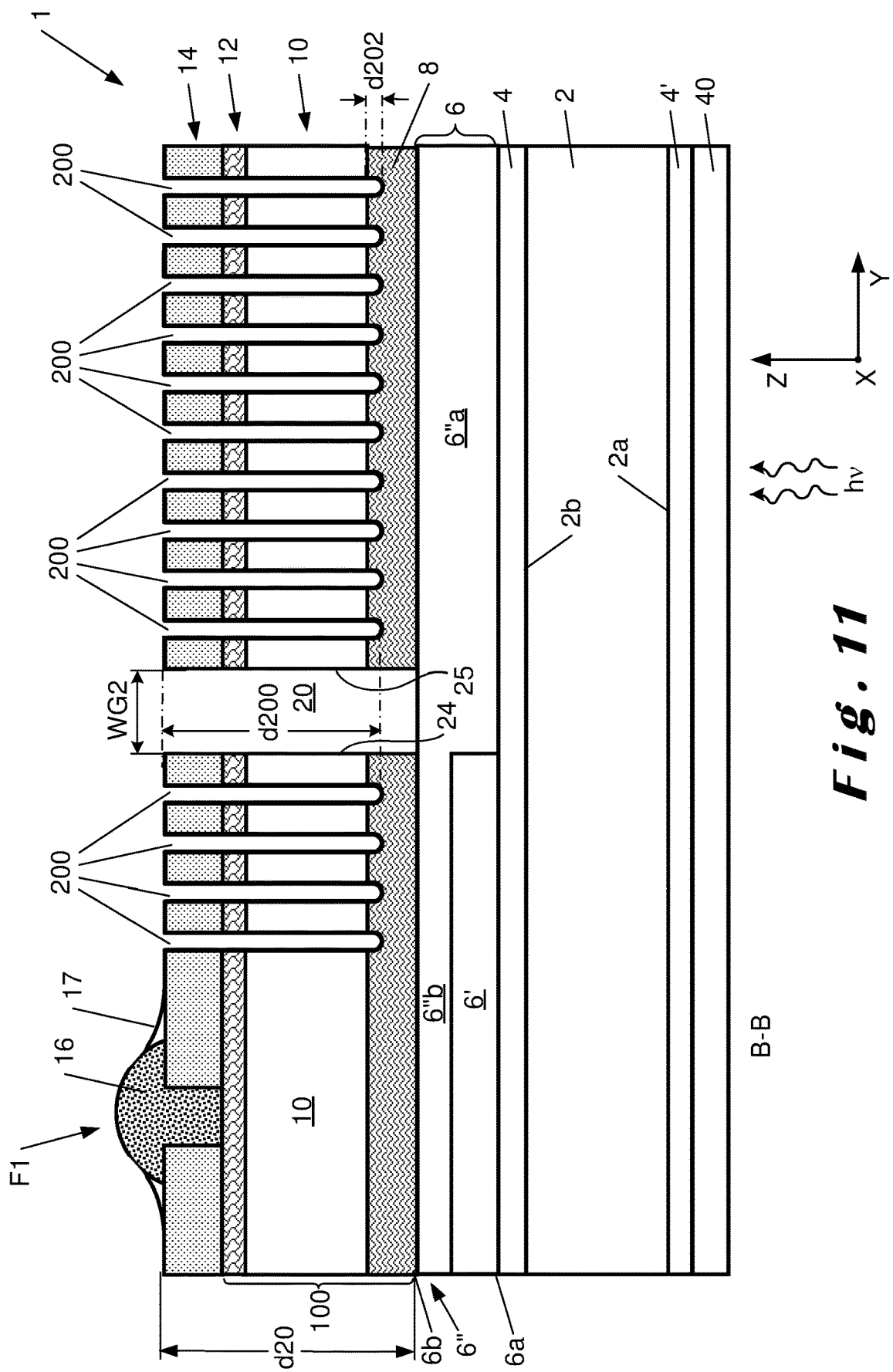
FIG. 11 illustrates the cross section of a device version comprising additional holes realized after etching.

In an embodiment, illustrated in FIG. 11, the photovoltaic device my comprise additional openings 200. This may be performed by an additional fabrication step G consisting in the realization of a plurality of additional openings 200 defined by third type apertures 14d in the isolation resist layer 14 and this to at least a predetermined depth d200 in said conductive layer 100. Said additional openings 200 can have any form of their horizontal cross sections such as round, elliptical, square, hexagonal, or star-like holes, lengthy trenches or even a combination of different forms. The largest lateral widths of the additional openings may be smaller than 10 μm, for example 2 μm, and may have a longitudinal dimension, defined in the length of the openings, that may be as great as the width of the substrate.

The embodiment of FIG. 11 relates to IBC cells that have a tunnel junction. But in variants such plurality of additional openings 200 may also be realized in IBC cells of the type illustrated in FIGS. 2-5.

The predetermined depth d200 depends on the individual composition of the conductive layer 100. In the case of a full metal layer or metal layer stack the depth d200 would be the thickness of the metal layer or metal layer stack d100 plus the thickness of the isolation resist layer d14, i.e., d200=d100+d14.

In the case of a layer stack where a transparent conductive oxide layer 8, having a thickness d8, is deposited first on top of the semiconducting structures 6', 6" the thickness d200 can be defined by:

$$d100+d14-d8 \leq d2 \leq d100+d14;$$

Said additional openings 200 may be realized over a depth d202 inside a transparent conductive oxide layer 8, as illustrated in FIG. 11.

Said additional openings can have any form, like round, elliptical, square, hexagonal, or star-like holes, lengthy trenches or even a combination of different forms.

Additional holes 200 can guarantee a certain transparence, and bi-faciality of the conductive layer even in the case of an opaque conductive layer 100 and by that potentially improve the efficiency of a photovoltaic system made of these photovoltaic devices.

In an embodiment, the method comprises a Step H consisting in connecting the conductive pads 16, 16' by respective electrically conducting ribbons and/or wires 18, 18'. More precisely, all the conductive pads 16 of the first-type doped collecting contact structures F1 are connected by first electrically conducting ribbons and/or wires 18, and all the conductive pads 16' of the second-type collecting contact structures F2 are connected by second electrically conducting ribbons and/or wires 18'. The first and second connecting wires or ribbons 18, 18' may have different shapes, widths, thicknesses or be made of different materials. The first and second connecting wires or ribbons 18, 18' have their mean length mainly in a longitudinal direction A-A. The first and second connecting wires or ribbons 18, 18' must not be necessarily straight wires but may be locally curved or bended. The connecting wires or ribbons can also be used to connect one photovoltaic device to a second photovoltaic device or second photovoltaic devices. Connecting first type of polarity of a first device to a second type of polarity of a second device by establishing a series connection of these two devices and/or connecting first type of polarity of a first device to a first type of polarity of a second device by establishing a parallel connection of the devices.

An essential aspect of the device of the invention is that the isolation resist layer 14 guarantees a total electrical separation of the wires or ribbons 18, 18'.

In an embodiment, the material of said conductive pads 16, 16' comprises an electrically conducting compound.

Said conductive pads are deposited as a paste comprising one of the materials: Tin (Sn), Indium (In) or Bismuth (Bi) Silver (Ag), Copper (Cu), Nickel (Ni), Aluminum (Al). Those pastes can be for example soldering pastes or polymer-based pastes or glues, low temperature potting pastes or the like that are used in either electronics bonding or for realizing contacts in solar cells. In an embodiment, said conductive layer 100, that may be a layer stack 8, 10, 12, is realized on the full surface of the rear side of the cell, i.e., at least covering more than 80%, preferably more than 95% of the full surface of the rear surface 140 of the PV cell 1.

Other possible materials of the conducting pads 16, 16' may be for example polymer pastes filled with graphene or graphite.

In an embodiment, each of said trenches 20 are trenches surrounding completely said first-type collecting contact structures F1. In an embodiment, each of said trenches 20 are trenches surrounding completely said second-type collecting contact structures F1. Trenches 20 may have any shape, engird first-type charge collecting areas IS1 and comprise any number of charges collecting structures of the same type F1 or F2. The charge collecting structures F1, F2 do not need to be aligned along a line as illustrated in the exemplary figures herein, but may be arranged according to a radial distribution, for example inside a circular shaped island IS1.

For clarity of understanding, the other type of charge collecting pads 16' are illustrated in the same FIG. 4 although they are located in a parallel plane, therefore the second type charge collecting pad 16' is illustrated with dashed lines.

In a second aspect the invention is achieved by an interdigitated back contact IBC photovoltaic device 1 having first-type collecting contact structures F1 and second-type collecting contact structures F2, the photovoltaic device 1 comprising a substrate 2 having first-type doped structures consisting in a plurality of n-doped or p-doped portions 6' and a second-type doped semiconducting structure 6", being of the other doped-type of said first-type doped structure and by that establishing alternating types of semiconducting contacts.

In advantageous embodiments the IBC cell may comprise a tunnel junction as illustrated in FIG. 4c. It is understood that all embodiments described herein apply also on IBC cells that comprise a tunnel junction.

It is understood also that all the possible features that may be provided according to any of the embodiments of the method steps, described herein, may be part of the interdigitated back contact IBC photovoltaic device 1.

On said first- and/or second type semiconducting structures 6', 6" a stack 100, 14, 16 is arranged, and comprises:
- a conductive layer 100;
- a patterned isolating resist layer 14 comprising first type and second type through apertures 14b, c that are respectively contact holes 14b and isolation holes 14c;
- conducting pads 16, 16' that are deposited on said resist layer 14 and into the contact apertures 14b so that an electrical contact is made to the conductive layer 100.

Figure 10:
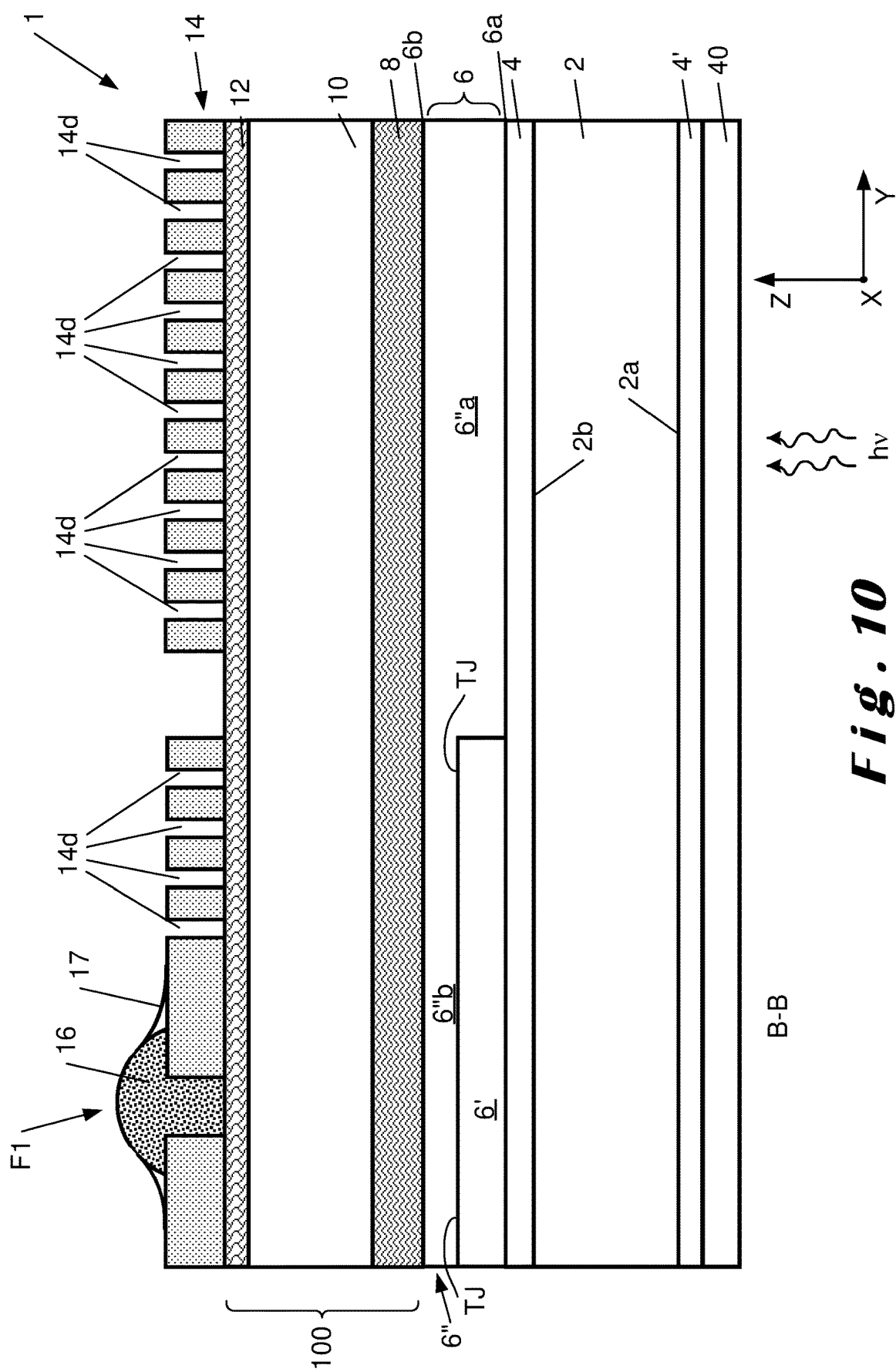
FIG. 10 illustrates a lateral vertical cross section of a device having apertures in the isolation resist layer of a device of the invention.

In variants, illustrated in e.g. FIGS. 10, 11, the contacts 16, 16' may have, in at least one cross section, the shape of a Gaussian curve 17. The trenches 20 in the conductive layer 100 are provided to separate electrically the first-type collecting contact structures F1 and the second-type collecting contact structures F2. The trenches 20 extend from the back surface 140 of said patterned isolating resist layer 14 to said first- and/or second-type doped semiconducting structures 6', 6".

In an embodiment the interdigitated IBC photovoltaic device 1 comprises doped semiconducting structures 6', 6" that provide a heterojunction contact to the crystalline silicon substrate 2.

In a further embodiment the interdigitated IBC photovoltaic device comprises semiconducting structures 6' of a first type of doping that are deposited locally on the back side of the device and a semiconducting structure of a second type of doping 6" that is deposited on the back side of the device 1 and covering at least partially the semiconducting structures 6' and by that providing a tunnel-junction at the contact zones between structures 6' and structure 6".

In an embodiment, the interdigitated back contact IBC photovoltaic device 1 comprises a plurality of holes 200 extending from the resist layer back surface 140 to at least a predetermined depth d2 in said conductive layer 100. The holes 200 may have any shape in any horizontal (X-Y) or vertical (X-Z, Y-Z) cross section plane.

The invention is also achieved by a photovoltaic system comprising at least two interdigitated back contact (IBC) photovoltaic devices 1 that are interconnected by conductors and wherein conducting pads of the first type 16 of a first cell are connected to conducting pads of the second type 16' of the second cell by that establishing a series connection of accordingly connected devices. The conducting pads of the first or second type 16, 16' of the first cell may be connected respectively to conducting pads of the first or second type 16, 16' of the second cell and so establishing a parallel connection of accordingly connected interdigitated back contact (IBC) photovoltaic devices 1.

In an embodiment, at least two interdigitated back contact (IBC) photovoltaic devices 1 are interconnected by electrical conductors 18, 18'.

The invention claimed is:

1. A method for manufacturing an interdigitated back contact photovoltaic device including a substrate defining a plane and, parallel to said plane, a longitudinal and a lateral direction, orthogonal to said lateral direction, the method comprising:
   providing a substrate of a first- or second-type doping that is an n-type or a p-type doping, the substrate having a front side and a back side, and applying a semiconducting structure on the back side, the semiconducting structure defining a front surface facing the back side of said substrate and a back surface opposite to said front surface, the semiconducting structure comprising individual doped portions of said first-type doping and a doped semiconducting structure of the second-type that is the other type than said first type, to provide alternating electrical charge-types of semiconducting contacts;
   providing a conductive layer on top of said doped semiconducting structures;
   applying a patterned isolation resist layer having a back surface onto said conductive layer, the formed resist layer comprising resist parts, contact apertures, and isolation apertures, the patterns of the isolation resist layer being aligned relative to said semiconducting structures;
   applying a plurality of conductive pads onto said patterned isolation resist layer, so that the conductive pads fill said contact apertures making electrical contact to said conductive layer; and
   etching the conductive layer in areas specified by the isolation apertures in the isolation resist layer, without extending into the semiconducting structure and creating trenches that do not extend into the semiconducting structure to form electrically separated first type charge collecting structures and second type charge collecting structures, after applying the conductive pads.

2. The method according to claim 1, wherein said conductive layer comprises at least one transparent conductive oxide or at least one metallic layer or a combination thereof.

3. The method according to claim 2, wherein said transparent conducting oxide layer is made of one of the oxides of the metals: Indium, Zinc, Tin, Tungsten or a combination thereof.

4. The method according to claim 2, wherein the material of said at least one metallic layer is chosen among: Copper, Silver, Aluminium, Nickel, Zinc, Tin Chromium, Beryllium, Gold or an alloy thereof.

5. The method according to claim 1, wherein the material of said conductive pads comprises an electrically conducting compound or paste.

6. The method according to claim 1, further comprising applying an additional isolation layer on the back side of the photovoltaic device by filling at least the trenches.

7. The method according to claim 1, further comprising creating a plurality of openings, defined by additional apertures in the isolation resist layer, to at least a predetermined depth in said conductive layer.

8. The method according to claim 1, further comprising connecting the conductive pads by respective electrically conducting ribbons and/or wires.

9. An interdigitated back contact photovoltaic device having first-type charge collecting structures and second-type charge collecting structures, the photovoltaic device comprising:

a substrate of a first-type doping that is an n-type or a p-type doping, the substrate having a front side and a back side; and a semiconducting structure applied to the back side of the substrate, the semiconducting structure defining a front surface facing the back side of said substrate and a back surface opposite to said front surface, the semiconducting structure comprising, on the back side of the substrate,
- a first-type-doped semiconducting structure including a plurality of n- or p-doped portions, and
- a second-type-doped semiconducting structure that is the other doped-type of said first-type-doped structure, wherein a layer stack is arranged on said semiconducting structure, the layer stack comprising:
- a conductive layer disposed on said semiconducting structures, the conductive layer including trenches provided therein, and
- a patterned isolating resist layer, defining a back surface facing away from said substrate, the patterned isolating resist layer being disposed on said conductive layer, the patterned isolating resist layer comprising contact apertures, isolation apertures, and conducting pads provided on said resist layer in said contact apertures where the conducting pads electrically contact the conductive layer and jut out of the contact apertures, wherein the trenches electrically separate the first-type charge collecting structures and the second-type charge collecting structures, said trenches being defined by said isolation apertures in the isolation resist layer, the trenches extending between said back surface to at most the back surface of said semiconducting structure and do not extend into the semiconducting structure.

10. The interdigitated back contact photovoltaic device according to claim 9, wherein said conductive layer comprises at least one transparent conductive oxide layer or at least one metallic layer or a combination thereof.

11. The interdigitated back contact photovoltaic device according to claim 10, wherein said trenches comprise a succession of openings of the different layers of said layer stack, said openings having lateral widths.

12. The interdigitated back contact photovoltaic device according to claim 11, wherein the lateral width of the opening in said at least one transparent conductive oxide layer is smaller than at least one of the lateral widths of the openings of the layers of said conductive layer.

13. The interdigitated back contact photovoltaic device according to claim 10, wherein said conductive layer comprises, on said at least one transparent conductive oxide layer, at least one metallic layer and at least one additional metallic layer, of which one is in contact with said at least one transparent conductive oxide layer, the lateral width of the aperture in said at least one additional metallic layer being smaller than the lateral width of the aperture in said at least one metallic layer.

14. The interdigitated back contact photovoltaic device according to claim 9, wherein the semiconducting structures provide a heterojunction contact with the crystalline silicon substrate.

15. The interdigitated back contact photovoltaic device according to claim 9, wherein the first-type-doped semiconducting structures are locally deposited on the back side of the photovoltaic device and the second-type-doped semiconducting structure is deposited on the back side of the device by at least partially covering the first-type-doped semiconducting structure, providing a tunnel-junction in the contact zones of the first- and second-type-doped semiconducting structures.

16. The interdigitated back contact photovoltaic device according to claim 9, further comprising an additional insulating layer is deposited on the back side of the photovoltaic device, at least within the trenches.

17. The interdigitated back contact photovoltaic device according to claim 9, further comprising a plurality of openings extending from the resist layer back surface to at least a predetermined depth in said conductive layer.

18. A photovoltaic system comprising:
- at least two interdigitated back contact photovoltaic devices according to claim 9, the at least two interdigitated back contact photovoltaic devices being interconnected by conductors,
- wherein conducting pads of the first type of the first cell are connected to conducting pads of the second type of the second cell thereby establishing a series connection of accordingly connected devices, and/or
- wherein conducting pads of the first or second type of the first cell are connected respectively to conducting pads of the first or second type of the second cell thereby establishing a parallel connection of accordingly connected devices.

19. The method according to claim 2, wherein the material of said conductive pads comprises an electrically conducting compound or paste.

20. The method according to claim 3, wherein the material of said conductive pads comprises an electrically conducting compound or paste.

* * * * *